US012757542B2

(12) United States Patent
Kim et al.

(10) Patent No.: US 12,757,542 B2
(45) Date of Patent: Oct. 6, 2026

(54) DISPLAY DEVICE

(71) Applicant: Samsung Display Co., LTD., Yongin-si (KR)

(72) Inventors: Hyung June Kim, Yongin-si (KR); Ji Hyun Min, Yongin-si (KR); Sang Ho Park, Yongin-si (KR); Se Hyung Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 414 days.

(21) Appl. No.: 18/334,512

(22) Filed: Jun. 14, 2023

(65) Prior Publication Data

US 2023/0420622 A1 Dec. 28, 2023

(30) Foreign Application Priority Data

Jun. 28, 2022 (KR) ........................ 10-2022-0079092

(51) Int. Cl.

| | |
|---|---|
| ***H01L 33/58*** | (2010.01) |
| ***H10H 20/831*** | (2025.01) |
| ***H10H 20/851*** | (2025.01) |
| ***H10H 20/855*** | (2025.01) |
| ***H10H 20/857*** | (2025.01) |
| ***H10W 90/00*** | (2026.01) |

(52) U.S. Cl.

CPC ...... *H10H 20/855* (2025.01); *H10H 20/8312* (2025.01); *H10H 20/8514* (2025.01); *H10H 20/857* (2025.01); *H10W 90/00* (2026.01)

(58) Field of Classification Search

CPC ............. H10H 20/855; H10H 20/8312; H10H 20/8514; H10H 20/857; H10H 20/841; H10H 20/851; H10H 20/813; H10H 20/818; H10H 20/814; H10H 29/142; H10H 20/8314; H01L 25/0753; H01L 25/167; H10D 86/451

See application file for complete search history.

(56) References Cited

U.S. PATENT DOCUMENTS

| | | | |
|---|---|---|---|
| 9,164,353 | B2 | 10/2015 | Jeon et al. |
| 10,720,607 | B2 | 7/2020 | Song |
| 11,430,374 | B2 | 8/2022 | Choi et al. |
| 2020/0212267 | A1 | 7/2020 | Kwak et al. |
| 2022/0130922 | A1 | 4/2022 | Park et al. |

(Continued)

FOREIGN PATENT DOCUMENTS

| | | |
|---|---|---|
| KR | 10-1202907 | 11/2012 |
| KR | 10-1383551 | 4/2014 |

(Continued)

*Primary Examiner* — Elmito Breval

(74) *Attorney, Agent, or Firm* — Womble Bond Dickinson (US) LLP

(57) ABSTRACT

A display device according to an embodiment includes a substrate including an emission area and a non-emission area, a plurality of light emitting elements disposed on the substrate, a first electrode and a second electrode disposed to be spaced apart from each other and electrically connected to plurality of the light emitting elements, a cover layer disposed on the first electrode and the second electrode, and a color conversion layer disposed on the cover layer. The cover layer includes a plurality of sub-insulating layers each including a first layer and a second layer sequentially stacked. The first layer and the second layer have different refractive indices.

20 Claims, 12 Drawing Sheets

(56) References Cited

U.S. PATENT DOCUMENTS

| | | | |
|---|---|---|---|
| 2022/0140019 | A1 | 5/2022 | Park et al. |
| 2022/0181521 | A1 | 6/2022 | Chu et al. |

FOREIGN PATENT DOCUMENTS

| | | | |
|---|---|---|---|
| KR | 10-2018-0090421 | | 8/2018 |
| KR | 10-2018-0110693 | | 10/2018 |
| KR | 10-2020-0079817 | | 7/2020 |
| KR | 10-2021-0073955 | | 6/2021 |
| KR | 10-2022-0054507 | | 5/2022 |
| KR | 10-2022-0060067 | A | 5/2022 |
| KR | 10-2022-0081455 | | 6/2022 |
| WO | 2007/136392 | | 11/2007 |

DISPLAY DEVICE

CROSS-REFERENCE TO RELATED APPLICATION(S)

This application claims priority to and benefits of Korean Patent Application No. 10-2022-0079092 under 35 U.S.C. § 119, filed on, Jun. 28, 2022, in the Korean Intellectual Property Office (KIPO), the entire content of which are incorporated herein by reference.

BACKGROUND

1. Technical Field

The disclosure relates to a display device.

2. Description of the Related Art

Recently, as interest in information display is increased, research and development of a display device are continuously being conducted.

SUMMARY

An object of the disclosure is to provide a display device capable of improving reliability.

A display device according to an embodiment may include a substrate including an emission area and a non-emission area, a plurality of light emitting elements disposed on the substrate, a first electrode and a second electrode disposed to be spaced apart from each other and electrically connected to plurality of the light emitting elements, a cover layer disposed on the first electrode and the second electrode, and a color conversion layer disposed on the cover layer. The cover layer may include a plurality of sub-insulating layers each including a first layer and a second layer sequentially stacked. The first layer and the second layer may have different refractive indices.

In an embodiment, the first layer may be a first inorganic layer having a first refractive index, and the second layer may be a second inorganic layer having a second refractive index.

In an embodiment, the first refractive index may be less than the second refractive index. The first inorganic layer may include silicon oxide, and the second inorganic layer may include silicon nitride.

In an embodiment, each of the plurality of sub-insulating layers may further include a third layer stacked on the second layer. The third layer may be a third inorganic layer having a third refractive index.

In an embodiment, the third refractive index may be different from the second refractive index.

In an embodiment, the second refractive index may be less than the first refractive index. The first inorganic layer may include silicon nitride, and the second inorganic layer may include silicon oxide.

In an embodiment, the cover layer may pass light within a wavelength range.

In an embodiment, the color conversion layer may include color conversion particles that convert light emitted from the plurality of light emitting elements into light having a different wavelength range.

In an embodiment, the display device may further include a first insulating layer disposed between the substrate and the plurality of light emitting elements, a second insulating layer disposed on each of the plurality of light emitting elements, and a third insulating layer disposed on the first electrode.

In an embodiment, a thickness of the cover layer may be less than or equal to about 2 μm.

In an embodiment, the display device may further include an additional insulating layer disposed between the first and second electrodes and the cover layer.

In an embodiment, the additional insulating layer may include an organic layer.

In an embodiment, a thickness of the additional insulating layer may be in a range of about 1.0 μm to about 1.3 μm.

In an embodiment, the additional insulating layer may include an inorganic layer.

In an embodiment, the display device may further include a first alignment electrode and a second alignment electrode disposed between the substrate and the first insulating layer and spaced apart from each other, a first bank disposed in the non-emission area and including an opening corresponding to the emission area, a second bank disposed on the first bank in the non-emission area and surrounding the color conversion layer, and a color filter disposed on the color conversion layer.

In an embodiment, the first electrode may be electrically connected to the first alignment electrode, and the second electrode may be electrically connected to the second alignment electrode.

In an embodiment, the display device may further include a pixel circuit layer disposed between the substrate and the plurality of light emitting elements and including at least one transistor electrically connected to the plurality of light emitting elements.

A display device according to another embodiment may include a plurality of light emitting elements disposed on a substrate, a first electrode and a second electrode disposed to be spaced apart from each other and electrically connected to the plurality of light emitting elements, a cover pattern disposed on the first electrode to cover the first electrode, and a color conversion layer disposed on the cover pattern. The cover pattern may include a plurality of sub-insulating layers each including a first layer and a second layer sequentially stacked, and an opening. The first layer and the second layer may have different refractive indices. The opening of the cover pattern may expose the second electrode.

In an embodiment, the color conversion layer may be disposed directly on the cover pattern and the second electrode, and the cover pattern is not disposed on the second electrode.

In an embodiment, the cover pattern may selectively transmit light within a predetermined wavelength range.

In a display device according to an embodiment, a cover layer having a distributed Bragg reflectors structure may be disposed between a light emitting element and a color conversion layer (or QD layer) to reflect light proceeding toward a rear surface of the color conversion layer to a front surface direction. Therefore, a luminance of a pixel may be improved by increasing light output efficiency of the pixel.

According to an embodiment, a cover layer may be disposed between a light emitting element and a color conversion layer to secure a distance between the light emitting element and the color conversion layer. Therefore, reliability of a display device may be improved by preventing deterioration of the color conversion layer.

An effect according to an embodiment of the disclosure is not limited to the contents illustrated above, and more various effects are included in the specification.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
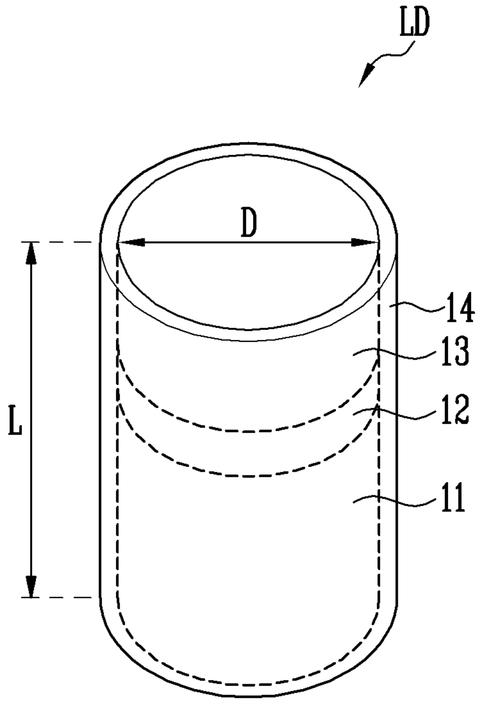
FIG. 1 is a schematic perspective view illustrating a light emitting element LD according to an embodiment.

The disclosure may be modified in various manners and have various forms. Therefore, specific embodiments will be illustrated in the drawings and will be described in detail in the specification. However, it should be understood that the disclosure is not intended to be limited to the disclosed specific forms, and the disclosure includes all modifications, equivalents, and substitutions within the spirit and technical scope of the disclosure.

Similar reference numerals are used for similar components in describing each drawing. In the accompanying drawings, the dimensions of the structures are shown enlarged from the actual dimensions for the sake of clarity of the disclosure. Terms of "first", "second", and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component.

It should be understood that in the application, a term of "include", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance. In addition, a case where a portion of a layer, a film, an area, a plate, or the like is referred to as being "on" another portion, it includes not only a case where the portion is "directly on" another portion, but also a case where there is further another portion between the portion and another portion. In addition, in the specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements.

Also, when an element is referred to as being "in contact" or "contacted" or the like to another element, the element may be in "electrical contact" or in "physical contact" with another element; or in "indirect contact" or in "direct contact" with another element.

In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure and others necessary for those skilled in the art to understand the disclosure will be described in detail with reference to the accompanying drawings. In the following description, the singular expressions include plural expressions unless the context clearly dictates otherwise.

Figure 2:
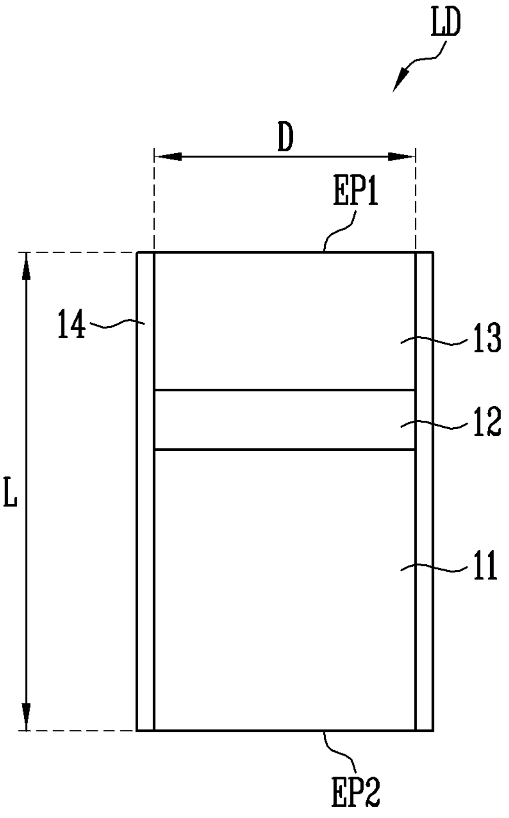
FIG. 2 is a schematic cross-sectional view of the light emitting element of FIG. 1.

FIG. 1 is a schematic perspective view illustrating a light emitting element LD according to an embodiment, and FIG. 2 is a schematic cross-sectional view of the light emitting element LD of FIG. 1.

Referring to FIGS. 1 and 2, the light emitting element LD may include a first semiconductor layer 11, a second semiconductor layer 13, and an active layer 12 disposed between the first semiconductor layer 11 and the second semiconductor layer 13. For example, the light emitting element LD may be implemented in a light emitting stack (or a stack pattern) in which the first semiconductor layer 11, the active layer 12, and the second semiconductor layer 13 are sequentially stacked. However, a type and/or a shape of the light emitting element LD are/is not limited to the embodiment shown in FIGS. 1 and 2.

The light emitting element LD may be provided in a shape extending in one direction. In case that an extension direction of the light emitting element LD is referred to as a length direction, the light emitting element LD may include a first end EP1 and a second end EP2 facing each other along the length direction. One of the first semiconductor layer 11 and the second semiconductor layer 13 may be positioned at the first end EP1 of the light emitting element LD, and another of the first semiconductor layer 11 and the second semiconductor layer 13 may be positioned at the second end EP2 of the light emitting element LD. For example, the second semiconductor layer 13 may be positioned at the first end EP1 of the light emitting element LD, and the first semiconductor layer 11 may be disposed at the second end EP2 of the light emitting element LD.

The light emitting element LD may be provided in various shapes. For example, as shown in FIG. 1, the light emitting element LD may have a rod-like shape, a bar-like shape, or a column shape that is long in the length direction (or having an aspect ratio greater than 1). In another example, the light emitting element LD may have a rod-like shape, a bar-like shape, or a column shape that is short in the length direction (or having an aspect ratio of less than 1). In still another example, the light emitting element LD may have a rod-like shape, a bar-like shape, or a column shape having an aspect ratio of 1.

The light emitting element LD may include, for example, a light emitting diode (LED) manufactured to be extremely small to have a diameter D and/or a length L of a nano scale (or nano meter) to a micro scale (or micro meter).

In case that the light emitting element LD is long in the length direction (for example, the aspect ratio is greater than 1), the diameter D of the light emitting element LD may be in a range of about 0.5 μm to about 6 μm, and the length L of the light emitting element LD may be in a range of about 1 μm to about 10 μm. However, the diameter D and the length L of the light emitting element LD are not limited thereto. A size of the light emitting element LD may be changed to satisfy a requirement condition (or a design condition) of a lighting device or a self-emission display device to which the light emitting element LD is applied.

The first semiconductor layer 11 may include, for example, at least one n-type semiconductor layer. For example, the first semiconductor layer 11 may include at least one semiconductor material such as InAlGaN, GaN, AlGaN, InGaN, AlN, and InN, and may be doped with a first conductive dopant (or an n-type dopant) such as Si, Ge, or Sn. However, the material configuring the first semiconductor layer 11 is not limited thereto, and other various materials may configure the first semiconductor layer 11.

The active layer 12 (or an emission layer) may be disposed (or located) on the first semiconductor layer 11 and may be formed in a single or multiple quantum well structure. For example, in case that the active layer 12 is formed in the multiple quantum well structure, in the active layer 12, a barrier layer (not shown), a strain reinforcing layer, and a well layer may be periodically and repeatedly stacked each other as one unit. However, a structure of the active layer 12 is not limited to the above-described embodiment.

The active layer 12 may emit light of a wavelength in a range of about 400 nm to about 900 nm, and may be configured as a double hetero structure. In an embodiment, a clad layer (not shown) doped with a conductive dopant may be formed on and/or under the active layer 12 along the length direction of the light emitting element LD. For example, the clad layer may be formed of AlGaN or InAlGaN. According to an embodiment, a material such as AlGaN or InAlGaN may be used to form the active layer 12, but the disclosure is not limited thereto, and other various materials may configure the active layer 12. The active layer 12 may include a first surface contacting the first semiconductor layer 11 and a second surface contacting the second semiconductor layer 13.

In case that an electric field of a predetermined (or selectable) voltage or more is applied to both ends of the light emitting element LD, the light emitting element LD may emit light while an electron-hole pair is combined in the active layer 12. By controlling light emission of the light emitting element LD by using such a principle, the light emitting element LD may be used as a light source (or a light emitting source) of various light emitting devices including a pixel of the display device.

The second semiconductor layer 13 may be disposed (or located) on the second surface of the active layer 12 and may include a semiconductor layer of a type different from that of the first semiconductor layer 11. For example, the second semiconductor layer 13 may include at least one p-type semiconductor layer. For example, the second semiconductor layer 13 may include at least one semiconductor material such as InAlGaN, GaN, AlGaN, InGaN, AlN, and InN, and may be doped with a second conductive dopant (or a p-type dopant) such as Mg, Zn, Ca, Sr, or Ba. However, the material configuring the second semiconductor layer 13 is not limited thereto, and other various materials may configure the second semiconductor layer 13.

In an embodiment, the first semiconductor layer 11 and the second semiconductor layer 13 may have different thicknesses in the length direction of the light emitting element LD. For example, the first semiconductor layer 11 may have a thickness thicker than that of the second semiconductor layer 13 along the length direction of the light emitting element LD.

In FIGS. 1 and 2, although the first semiconductor layer 11 and the second semiconductor layer 13 are shown as being configured of one layer, the disclosure is not limited thereto. In an embodiment, according to the material of the active layer 12, each of the first semiconductor layer 11 and the second semiconductor layer 13 may include at least one or more layers, for example, a clad layer and/or a tensile strain barrier reducing (TSBR) layer. The TSBR layer may be a strain relief layer disposed between semiconductor layers having different lattice structures and serving as a buffer for reducing a lattice constant difference. The TSBR layer may be configured of a p-type semiconductor layer such as p-GaInP, p-AlInP, and p-AlGaInP, but is not limited thereto.

According to an embodiment, the light emitting element LD may include a contact electrode (hereinafter referred to as a 'first contact electrode') disposed on the second semiconductor layer 13 in addition to the above-described first semiconductor layer 11, active layer 12, and second semiconductor layer 13. According to another embodiment, the light emitting element LD may include another contact electrode (hereinafter referred to as a 'second contact electrode') disposed at one end of the first semiconductor layer 11.

Each of the first and second contact electrodes may be an ohmic contact electrode, but is not limited thereto. According to an embodiment, the first and second contact electrodes may be schottky contact electrodes. The first and second contact electrodes may include a conductive material. For example, the first and second contact electrodes may include an opaque metal such as chromium (Cr), titanium (Ti), aluminum (Al), gold (Au), nickel (Ni), an oxide thereof, an alloy thereof, and the like, but are not limited thereto. According to an embodiment, the first and second contact electrodes may include transparent conductive oxide such as indium tin oxide (ITO), indium zinc oxide (IZO), zinc oxide ($ZnO_x$), indium gallium zinc oxide (IGZO), and indium tin zinc oxide (ITZO). The zinc oxide ($ZnO_x$) may be zinc oxide (ZnO) and/or zinc peroxide ($ZnO_2$).

The materials included in the first and second contact electrodes may be the same as or different from each other. The first and second contact electrodes may be substantially transparent or translucent. Therefore, light generated by the light emitting element LD may pass through each of the first and second contact electrodes and may be emitted to the outside of the light emitting element LD. According to an embodiment, in case that the light generated by the light emitting element LD does not pass through the first and second contact electrodes and is emitted to the outside of the light emitting element LD through an area except for both ends of the light emitting element LD, the first and second contact electrodes may include an opaque metal.

In an embodiment, the light emitting element LD may include an insulating film 14. However, the insulating film 14 may be omitted or may be provided so as to cover only a portion of the first semiconductor layer 11, the active layer 12, and the second semiconductor layer 13.

The insulating film 14 may prevent an electrical short that may occur in case that the active layer 12 contacts a conductive material other than the first and second semiconductor layers 11 and 13. The insulating film 14 may reduce or minimize a surface defect of the light emitting element LD to improve life and light emission efficiency of the light emitting element LD. In case that multiple light emitting elements LD are closely disposed, the insulating film 14 may prevent an unwanted short that may occur between the light emitting elements LD. As long as the active layer 12 prevents occurrence of a short with an external conductive material, presence or absence of the insulating film 14 is not limited.

The insulating film 14 may entirely surround an outer circumferential surface of the light emitting stack including the first semiconductor layer 11, the active layer 12, and the second semiconductor layer 13.

In the above-described embodiment, the insulating film 14 may entirely surround the outer circumferential surface of each of the first semiconductor layer 11, the active layer 12, and the second semiconductor layer 13, but the disclosure is not limited thereto. According to an embodiment, in case that the light emitting element LD includes the first contact electrode, the insulating film 14 may entirely surround an outer circumferential surface of each of the first semiconductor layer 11, the active layer 12, the second semiconductor layer 13, and the first contact electrode. According to another embodiment, the insulating film 14 may not entirely surround the outer circumferential surface of the first contact electrode, or may surround only a portion of the outer circumferential surface of the first contact electrode and may not surround the rest of the outer circumferential surface of the first contact electrode. According to an embodiment, in case that the first contact electrode is disposed at the first end of the light emitting element LD and the second contact electrode is disposed at the second end of the light emitting element LD, the insulating film 14 may expose at least one area of each of the first and second contact electrodes.

The insulating film 14 may include a transparent insulating material. For example, the insulating film 14 may include at least one insulating material selected from a group consisting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanium strontium oxide ($SrTiO_x$), cobalt oxide ($Co_xO_y$), magnesium oxide (MgO), zinc oxide ($ZnO_x$), rucenium oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, InxOy:H, niobium oxide ($Nb_xO_y$), magnesium fluoride ($MgF_x$), aluminum fluoride ($AlF_x$), Alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), and vanadium nitride (VN), but the disclosure is not limited thereto, and various materials having insulating properties may be used as the material of the insulating film 14.

The insulating film 14 may be provided in a form of a single layer, or may be provided in a form of multiple layers including double layers. For example, in case that the insulating film 14 is formed of double layers including a first layer and a second layer sequentially stacked, the first layer and the second layer may be formed of different materials (or substances), and may be formed in different processes. According to an embodiment, the first layer and the second layer may be formed by a continuous process by including the same material.

According to an embodiment, the light emitting element LD may be implemented with a light emitting pattern of a core-shell structure. The above-described first semiconductor layer 11 may be positioned in a core, for example, a middle (or a center) of the light emitting element LD, the active layer 12 may surround the outer circumferential surface of the first semiconductor layer 11, and the second semiconductor layer 13 may surround the outer circumferential surface of the active layer 12. The light emitting element LD may include a contact electrode (not shown) surrounding at least one side of the second semiconductor layer 13. According to an embodiment, the light emitting element LD may further the insulating film 14 provided on an outer circumferential surface of the light emitting pattern of the core-shell structure and including a transparent insulating material. The light emitting element LD implemented with the light emitting pattern of the core-shell structure may be manufactured by a growth method.

A light emitting unit (or a light emitting device) including the above-described light emitting element LD may be used as a light emitting source (or a light source) of various display devices. The light emitting element LD may be manufactured through a surface treatment process. For example, in case that multiple light emitting elements LD are mixed in a fluid solution (or solvent) and supplied to each pixel area (for example, an emission area of each pixel or an emission area of each sub-pixel), surface treatment may be performed on each of the light emitting elements LD so that the light emitting elements LD may be uniformly sprayed without being unevenly aggregated in the solution.

A light emitting unit (or a light emitting device) including the light emitting element LD described above may be used in various types of electronic devices that require a light source, including a display device. For example, in case that multiple light emitting elements LD are disposed in a pixel area of each pixel of a display panel, the light emitting elements LD may be used as a light source of each pixel.

However, an application field of the light emitting element LD is not limited to the above-described example. For example, the light emitting element LD may be used in other types of electronic devices that require a light source, such as a lighting device.

Figure 3:
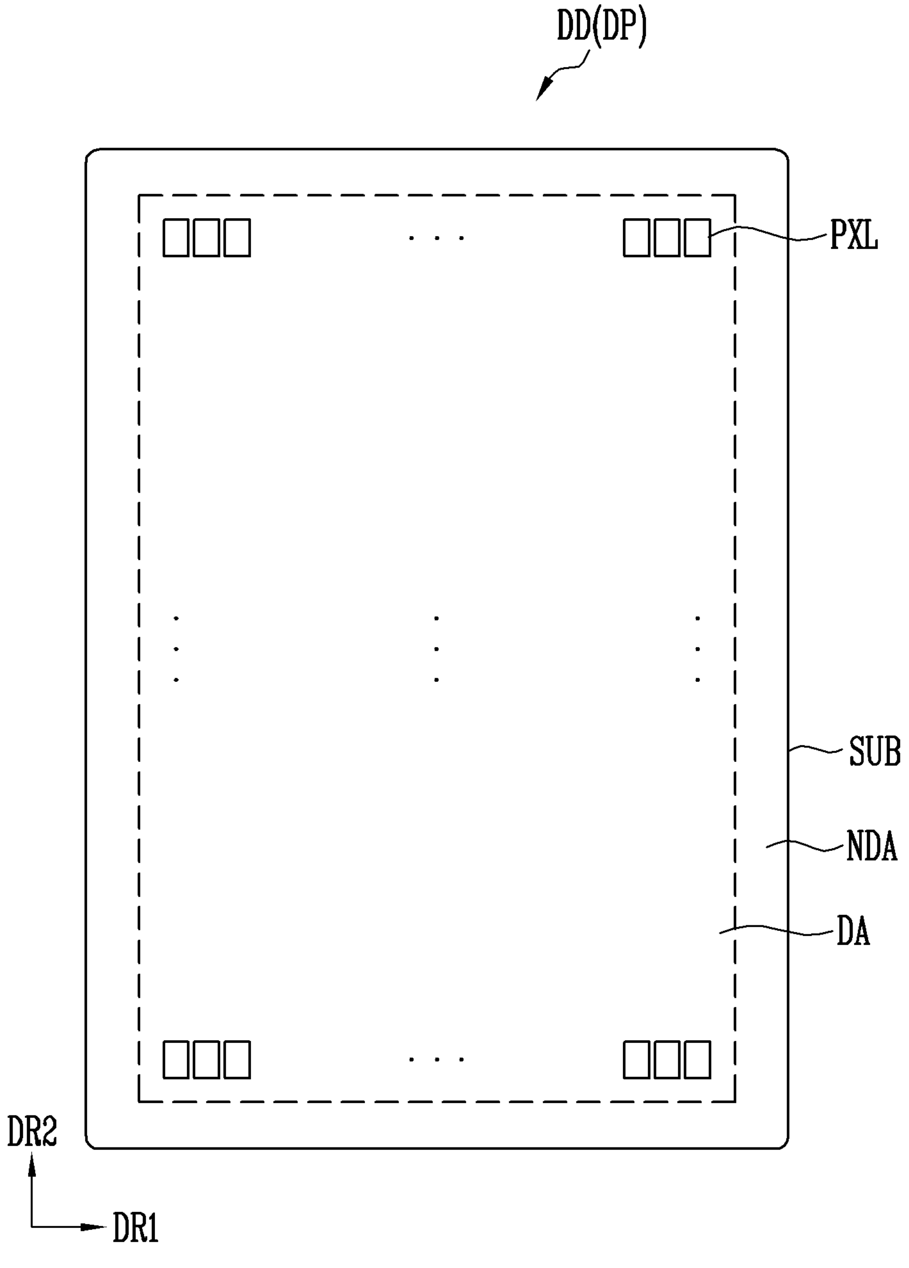
FIG. 3 is a schematic plan view illustrating a display device according to an embodiment.

FIG. 3 is a schematic plan view illustrating a display device DD according to an embodiment.

In FIG. 3, for convenience, a structure of the display device DD, for example, a display panel DP included in the display device DD, is schematically shown based on a display area DA where an image is displayed.

As long as the display device DD is an electronic device to which a display surface is applied to at least one surface, such as a smartphone, a television, a tablet PC, a mobile phone, a video phone, an electronic-book reader, a desktop PC, a laptop PC, a netbook computer, a workstation, a server, a personal digital assistant (PDA), a portable multimedia player (PMP), an MP3 player, a medical device, a camera, or wearable device, the disclosure may be applied to the display device.

Referring to FIGS. 1 to 3, the display device DD may be a passive matrix type display device or an active matrix type display device according to a method of driving the light emitting element LD. For example, in case that the display device is implemented as an active matrix type display device, each of the pixels PXL may include a driving transistor that controls a current amount supplied to the light emitting element LD, a switching transistor that transfers a data signal to the driving transistor, and the like.

The display panel DP (or the display device DD) may include a substrate SUB and pixels PXL disposed on the substrate SUB. Each pixel PXL may include at least one light emitting element LD.

The substrate SUB may include a display area DA and a non-display area NDA.

The display area DA may be an area where the pixels PXL displaying an image are provided. The non-display area NDA may be an area in which a driver for driving each pixel PXL and multiple lines electrically connecting each pixel PXL and the driver are provided.

The non-display area NDA may be positioned adjacent to the display area DA. The non-display area NDA may be provided on at least one side of the display area DA. For example, the non-display area NDA may surround a circumference (or an edge) of the display area DA. The lines electrically connected to each pixel PXL and the driver electrically connected to the lines and driving the pixel PXL may be provided in the non-display area NDA.

The lines may electrically connect the driver and each pixel PXL. The lines may include a fan-out line electrically connected to signal lines providing a signal to the pixel PXL and electrically connected to each pixel PXL, for example, a scan line, a data line, or the like. According to an embodiment, the lines may include a fan-out line electrically connected to signal lines, for example, a control line, a sensing line, or the like, connected to each pixel PXL to compensate for an electrical characteristic of each pixel PXL in real time. The lines may also include a fan-out line electrically connected to power lines providing a predetermined (or selectable) voltage to each pixel PXL and electrically connected to each pixel PXL.

The substrate SUB may include a transparent insulating material and may transmit light. The substrate SUB may be a rigid substrate or a flexible substrate.

The rigid substrate may be, for example, one of a glass substrate, a quartz substrate, a glass ceramic substrate, and a crystalline glass substrate.

The flexible substrate may be one of a film substrate and a plastic substrate including a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

An area of the substrate SUB may be provided as the display area DA and thus the pixels PXL may be disposed. The remaining area of the substrate SUB may be provided as the non-display area NDA. For example, the substrate SUB may include the display area DA including pixel areas in which each pixel PXL is disposed, and the non-display area NDA disposed around the display area DA (or adjacent to the display area DA).

Each of the pixels PXL may be provided in the display area DA on the substrate SUB. In an embodiment, the pixels PXL may be arranged in the display area DA in a stripe arrangement structure or the like, but are not limited thereto.

Each of the pixels PXL may include a pixel circuit layer (refer to "PCL" of FIG. 6) and a display element layer (refer to "DPL" of FIG. 6) positioned on the substrate SUB.

In the pixel circuit layer, a pixel circuit (refer to "PXC" of FIG. 4) may be disposed on the substrate SUB and may include multiple transistors and signal lines connected to the transistors. For example, each transistor may have a structure in which a semiconductor layer, a gate electrode, and a first terminal and a second terminal are sequentially stacked with an insulating layer interposed therebetween. The semiconductor layer may include amorphous silicon, poly silicon, low temperature poly silicon, an organic semiconductor, and/or an oxide semiconductor. The gate electrode, the first terminal (or a source area), and the second terminal (or a drain area) may include at least one of aluminum (Al), copper (Cu), titanium (Ti), and molybdenum (Mo), but are not limited thereto. The pixel circuit layer may include at least one or more insulating layers.

The display element layer may be disposed on the pixel circuit layer. An emission component (refer to "EMU" of FIG. 4) including a light emitting element LD that emits light may be positioned in the display element layer DPL. A first alignment electrode (or a first alignment line) and a second alignment electrode (or a second alignment line) spaced apart from each other may be disposed in the light emitting unit. The light emitting element LD may be disposed between the first alignment electrode and the second alignment electrode. Configurations of each pixel PXL are described later with reference to FIGS. 5 to 10.

Each pixel PXL may include at least one light emitting element LD driven by corresponding scan signal and data signal. The light emitting element LD may have a size as small as a nano scale (or nano meter) to a micro scale (or micro meter) and may be connected in parallel with adjacently disposed light emitting elements, but the disclosure is not limited thereto. The light emitting element LD may configure a light source of each pixel PXL.

Figure 4:
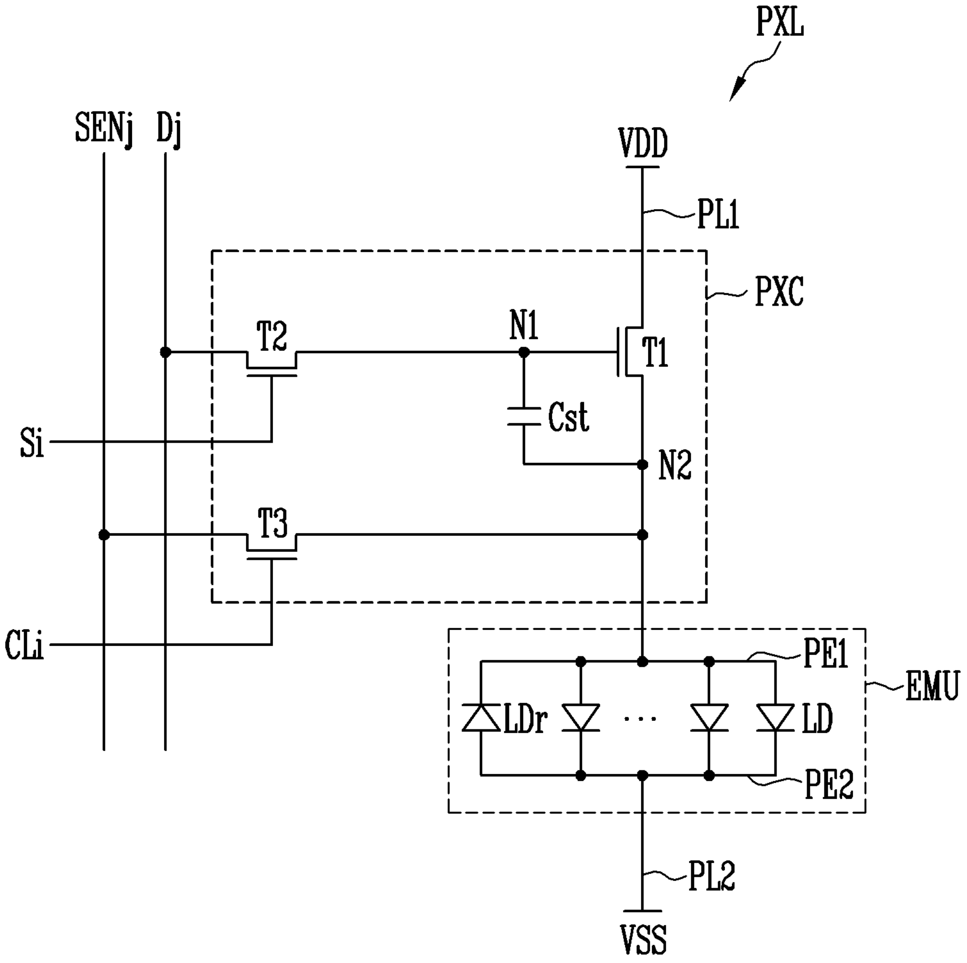
FIG. 4 is a schematic diagram of an equivalent circuit of a pixel illustrating an electrical connection relationship between components included in each of pixels shown in FIG. 3.

FIG. 4 is a schematic diagram of an equivalent circuit of a pixel illustrating an electrical connection relationship between components included in each of the pixels PXL shown in FIG. 3.

For example, FIG. 4 shows the electrical connection relationship between the components included the pixel PXL that may be applied to an active matrix type display device according to an embodiment. However, the connection relationship between the components of each pixel PXL is not limited thereto.

Referring to FIGS. 1 to 4, the pixel PXL may include an emission component EMU (or an emission unit) that generates light of a luminance corresponding to a data signal. The pixel PXL may include a pixel circuit PXC for driving the emission component EMU.

According to an embodiment, the emission component EMU may include multiple light emitting elements LD connected in parallel between a first power line PL1 which is electrically connected to first driving power VDD and to which a voltage of the first driving power VDD is applied and a second power line PL2 which is electrically connected to second driving power VSS and to which a voltage of the second driving power VSS is applied. For example, the emission component EMU may include a first electrode PE1 (or a first pixel electrode) electrically connected to the first driving power VDD through the pixel circuit PXC and the first power line PL1, a second electrode PE2 (or a second pixel electrode) electrically connected to the second driving power VSS through the second power line PL2, and the light emitting elements LD electrically connected in parallel in the same direction between the first and second electrodes PE1 and PE2. In an embodiment, the first electrode PE1 may be an anode, and the second electrode PE2 may be a cathode.

Each of the light emitting elements LD included in the emission component EMU may include an end (or the first end EP1) electrically connected to the first driving power VDD through the first electrode PE1 and another end (or the second end EP2) electrically connected to the second driving power VSS through the second electrode PE2. The first driving power VDD and the second driving power VSS may have different potentials. For example, the first driving power VDD may be high potential power, and the second driving power VSS may be low potential power. A potential difference between the first driving power VDD and the second driving power VSS may be set as a threshold voltage or more of the light emitting elements LD during an emission period of the pixel PXL.

As described above, the respective light emitting elements LD electrically connected in parallel in the same direction (for example, a forward direction) between the first electrode PE1 and the second electrode PE2 to which the voltages of the different power are supplied may configure respective effective light sources.

The light emitting elements LD of the emission component EMU may emit light with a luminance corresponding to a driving current supplied through a corresponding pixel circuit PXC. For example, a driving current corresponding to a grayscale value of corresponding frame data of the pixel circuit PXC may be supplied to the emission component EMU during each frame period. The driving current supplied to the emission component EMU may be divided and flow to each of the light emitting elements LD. Therefore, each of the light emitting elements LD may emit light with a luminance corresponding to the current flowing through the light emitting element LD, and thus the emission component EMU may emit light of the luminance corresponding to the driving current.

An embodiment in which both ends EP1 and EP2 of the light emitting elements LD are electrically connected in the same direction between the first and second driving power VDD and VSS is described, but the disclosure is not limited thereto. According to an embodiment, the emission component EMU may further include at least one ineffective light source, for example, a reverse light emitting element LDr, in addition to the light emitting elements LD configuring each effective light source. The reverse light emitting element LDr may be electrically connected in parallel between the first and second electrodes PE1 and PE2 together with the light emitting elements LD configuring the effective light sources, and may be electrically connected between the first and second electrodes PE1 and PE2 in a direction opposite to the light emitting elements LD are electrically connected. The reverse light emitting element LDr may maintain an inactivated state even though a predetermined (or selectable) driving voltage (for example, a driving voltage of a forward direction) is applied between the first and second electrodes PE1 and PE2, and thus a current does not substantially flow through the reverse light emitting element LDr.

The pixel circuit PXC of the pixel PXL may be electrically connected to a scan line Si and a data line Dj. The pixel circuit PXC of the pixel PXL may be electrically connected to a control line CLi and a sensing line SENj. For example, in case that the pixel PXL is disposed in an i-th row and a j-th column of the display area DA, the pixel circuit PXC of the pixel PXL may be electrically connected to the i-th scan line Si, the j-th data line Dj, the i-th control line CLi, and the j-th sensing line SENj of the display area DA.

The pixel circuit PXC may include first to third transistors T1 to T3 and a storage capacitor Cst.

The first transistor T1 may be a driving transistor for controlling the driving current applied to the emission component EMU, and may be electrically connected between the first driving power VDD and the emission component EMU. For example, a first terminal of the first transistor T1 may be electrically connected to the first driving power VDD through the first power line PL1, a second terminal of the first transistor T1 may be electrically connected to a second node N2, and a gate electrode of the first transistor T1 may be electrically connected to a first node N1. The first transistor T1 may control an amount of the driving current applied from the first driving power VDD to the emission component EMU through the second node N2, according to a voltage applied to the first node N1. In an embodiment, the first terminal of the first transistor T1 may be a drain electrode, and the second terminal of the first transistor T1 may be a source electrode, but the disclosure is not limited thereto. According to an embodiment, the first terminal may be a source electrode and the second terminal may be a drain electrode.

The second transistor T2 may be a switching transistor that selects the pixel PXL in response to a scan signal and activates the pixel PXL, and may be electrically connected between the data line Dj and the first node N1. A first terminal of the second transistor T2 may be electrically connected to the data line Dj, a second terminal of the second transistor T2 may be electrically connected to the first node N1, and a gate electrode of the second transistor T2 may be electrically connected to the scan line Si. The first terminal and the second terminal of the second transistor T2 may be different terminals. For example, in case that the first terminal is a drain electrode, the second terminal may be a source electrode.

The second transistor T2 may be turned on in case that a scan signal of a gate-on voltage (for example, a high level voltage) is supplied from the scan line Si, to electrically connect the data line Dj and the first node N1. The first node N1 may be a point where the second terminal of the second transistor T2 and the gate electrode of the first transistor T1 are electrically connected, and the second transistor T2 may transmit a data signal to the gate electrode of the first transistor T1.

The third transistor T3 may electrically connect the first transistor T1 to the sensing line SENj to obtain a sensing signal through the sensing line SENj, and detect a characteristic of the pixel PXL including a threshold voltage and the like of the first transistor T1 using the sensing signal. Information on the characteristic of the pixel PXL may be used to convert image data so that a characteristic deviation between the pixels PXL may be compensated. A second terminal of the third transistor T3 may be electrically connected to the second terminal of the first transistor T1, a first terminal of the third transistor T3 may be electrically connected to the sensing line SENj, and a gate electrode of the third transistor T3 may be electrically connected to the control line CLi. The first terminal of the third transistor T3 may be electrically connected to initialization power. The third transistor T3 may be an initialization transistor capable of initializing the second node N2, and may be turned on in case that a sensing control signal is supplied from the control line CLi, to transmit a voltage of the initialization power to the second node N2. Accordingly, a second storage electrode of the storage capacitor Cst electrically connected to the second node N2 may be initialized.

The storage capacitor Cst may include a first storage electrode (or a lower electrode) and a second storage electrode (or an upper electrode). The first storage electrode of the storage capacitor Cst may be electrically connected to the first node N1, and the second storage electrode of the storage capacitor Cst may be electrically connected to the second node N2. The storage capacitor Cst may charge a data voltage corresponding to the data signal supplied to the first node N1 during one frame period. Accordingly, the storage capacitor Cst may store a voltage corresponding to a voltage difference between a voltage of the gate electrode of the first transistor T1 and a voltage of the second node N2.

In FIG. 4, an embodiment in which all of the light emitting elements LD configuring the emission component EMU are electrically connected in parallel, but the disclosure is not limited thereto. According to an embodiment, the emission component EMU may be configured to include at least one series stage (or stage) including multiple light emitting elements LD electrically connected in parallel to each other. For example, the emission component EMU may be configured in a series/parallel mixed structure.

In FIG. 4, an embodiment in which all of the first, second, and third transistors T1, T2, and T3 included in the pixel circuit PXC are N-type transistors is disclosed, but the disclosure is not limited thereto. For example, at least one of the above-described first, second, and third transistors T1, T2, and T3 may be changed to a P-type transistor. In FIG. 4, an embodiment in which the emission component EMU is electrically connected between the pixel circuit PXC and the second driving power VSS is disclosed, but the emission component EMU may be electrically connected between the first driving power VDD and the pixel circuit PXC.

The structure of the pixel circuit PXC may be variously changed and implemented. For example, the pixel circuit PXC may further include a transistor for initializing the first node N1 and/or a transistor for controlling an emission time of the light emitting elements LD, or other circuit elements such as a boosting capacitor for boosting the voltage of the first node N1.

In the following embodiment, for convenience of description, a horizontal direction (or an X-axis direction) on a plane is indicated as a first direction DR1, a vertical direction (or a Y-axis direction) on the plane is indicated as a second direction DR2, and a vertical direction of the plane is indicated as a third direction DR3.

Figure 5:
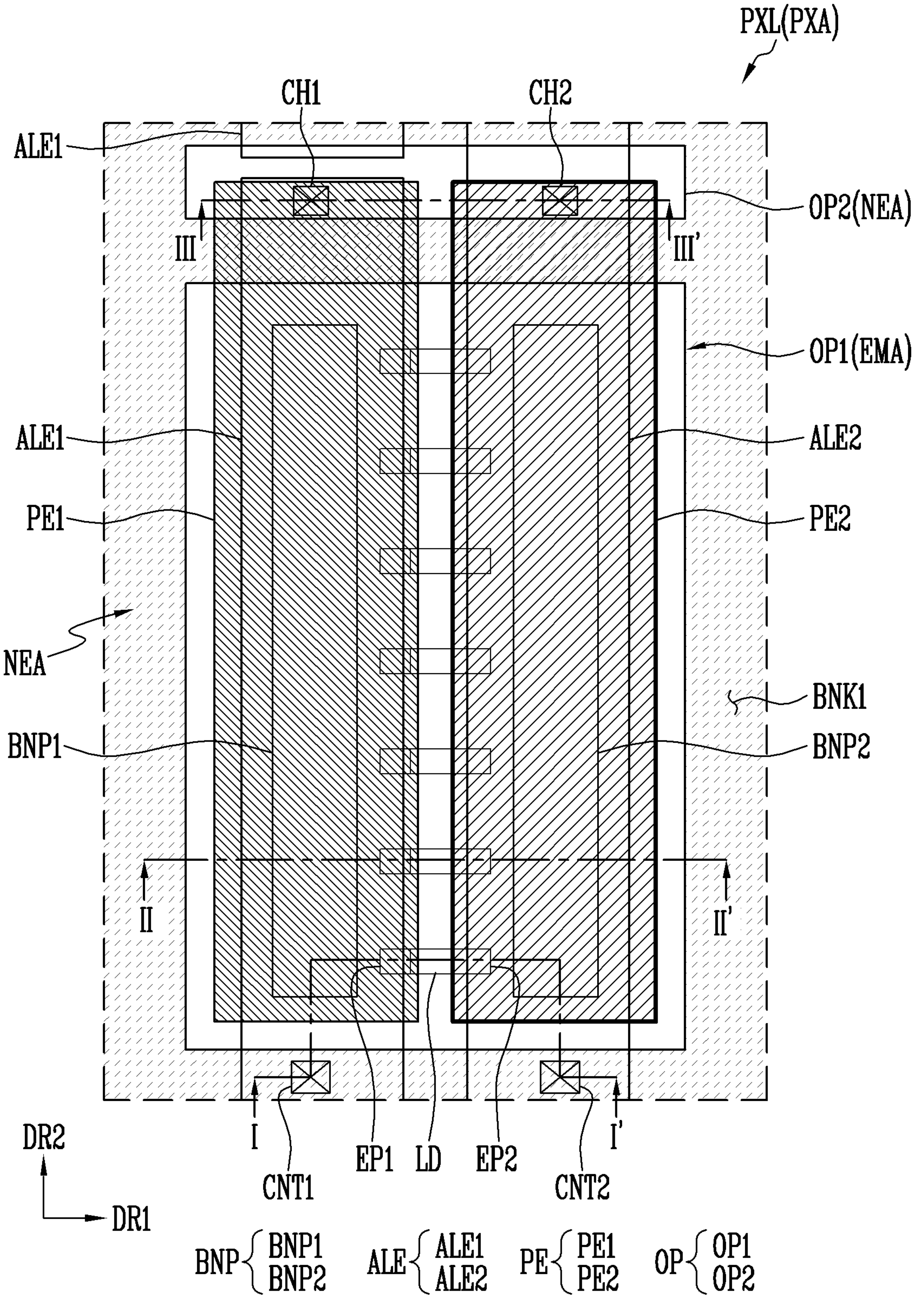
FIG. 5 is a plan view schematically illustrating the pixel shown in FIG. 3.

FIG. 5 is a plan view schematically illustrating the pixel PXL shown in FIG. 3.

In FIG. 5, transistors electrically connected to the light emitting elements LD and signal lines electrically connected to the transistors are omitted for convenience.

In the following embodiment, not only components included in the pixel PXL shown in FIG. 5 but also an area in which the components are provided (or positioned) are collectively referred to as a pixel PXL.

Referring to FIGS. 1 to 5, the pixel PXL may be positioned in a pixel area PXA arranged (or provided) on the substrate SUB. The pixel area PXA may include an emission area EMA and a non-emission area NEA.

The pixel PXL may include a first bank BNK1 positioned in the non-emission area NEA and the light emitting elements LD positioned in the emission area EMA.

The first bank BNK1 may be a structure defining (or partitioning) the pixel area (or the emission area EMA) of each of the pixel PXL from adjacent pixels PXL, and may be, for example, a pixel defining layer.

In an embodiment, the first bank BNK1 may be a pixel defining layer or a dam structure defining each emission area EMA to which the light emitting elements LD are to be supplied in a process of supplying (or inputting) the light emitting elements LD to the pixel PXL. For example, the emission area EMA of the pixel PXL may be partitioned by the first bank BNK1, and thus a mixed solution (for example, ink) including a desired amount and/or type of light emitting element LD may be supplied (or injected) to the emission area EMA. According to an embodiment, the first bank BNK1 may be a pixel defining layer that defines each emission area EMA to which a color conversion layer (refer to "CCL" of FIG. 6) is to be supplied in a process of supplying a color conversion layer CCL to the pixel PXL.

According to an embodiment, the first bank BNK1 may include at least one light blocking material and/or reflective material (or a scattering material), to prevent a light leakage defect in which light (or rays) is leaked between the pixel PXL and the pixels PXL adjacent thereto. According to an embodiment, the first bank BNK1 may include a transparent material (or substance). The transparent material may include, for example, a polyamide resin, a polyimide resin, and the like, but is not limited thereto. According to another embodiment, a reflective layer may be separately provided and/or formed on the first bank BNK1 to further improve efficiency of light emitted from the pixel PXL.

The first bank BNK1 may include at least one opening OP exposing elements positioned thereunder in the pixel area PXA. For example, the first bank BNK1 may include a first opening OP1 and a second opening OP2 exposing elements positioned under the first bank BNK1 in the pixel area PXA. In an embodiment, the emission area EMA of the pixel PXL and the first opening OP1 of the first bank BNK1 may correspond to each other.

In the pixel area PXA, the second opening OP2 may be positioned to be spaced apart from the first opening OP1 and may be positioned adjacent to a side, for example, an upper side, of the pixel area PXA in a plan view. In an embodiment, the second opening OP2 may be an electrode separation area in which at least one alignment electrode ALE is separated from another alignment electrode ALE provided to the adjacent pixel PXL in the second direction DR2, but is not limited thereto.

The pixel PXL may include electrodes PE provided at least in the emission area EMA, the light emitting elements LD electrically connected to the electrodes PE, a bank pattern BNP provided at a position corresponding to the electrodes PE, and alignment electrodes ALE. For example, the pixel PXL may include first and second electrodes PE1 and PE2 provided at least in the emission area EMA, the light emitting elements LD, the first and second alignment electrodes ALE1 and ALE2, and first and second bank patterns BNP1 and BNP2. The number, a shape, a size, an arrangement structure, and the like of each of the electrodes PE and/or the alignment electrodes ALE may be variously changed according to the structure of the pixel PXL (for example, the emission component EMU).

In an embodiment, the bank patterns BNP, the alignment electrodes ALE, the light emitting elements LD, and the electrodes PE may be sequentially provided on a surface of the substrate SUB on which the pixel PXL is provided, but are not limited thereto. According to an embodiment, a position and a shape of electrode patterns configuring the pixel PXL (or the emission component EMU) may be variously changed. A stack structure of the pixel PXL is described later with reference to FIGS. 6 to 10.

The bank patterns BNP may be provided at least in the emission area EMA and may be spaced apart from each other in the first direction DR1 in the emission area EMA, and each of the bank patterns BNP may extend along the second direction DR2. The bank patterns BNP may include a first bank pattern BNP1 and a second bank pattern BNP2 arranged to be spaced apart from each other in the first direction DR1.

Each bank pattern BNP (also referred to as a "wall pattern", a "protrusion pattern", a "support pattern", or a "wall structure") may have a uniform width in the emission area EMA. For example, each of the first and second bank patterns BNP1 and BNP2 may have a bar shape having a width along a direction in which each of the first and second bank patterns BNP1 and BNP2 extends in the emission area EMA in a plan view, but is not limited thereto.

The bank pattern BNP may support each of the first and second alignment electrodes ALE1 and ALE2 to change a surface profile (or shape) of each of the first and second alignment electrodes ALE1 and ALE2 so that light emitted from the light emitting elements LD is guided in an image display direction (or a front surface direction) of the display device DD.

The bank patterns BNP may have same or different widths. For example, the first and second bank patterns BNP1 and BNP2 may have same width or different widths in the first direction DR1 at least in the emission area EMA.

Each of the first and second bank patterns BNP1 and BNP2 may partially overlap at least one alignment electrode ALE at least in the emission area EMA. For example, the first bank pattern BNP1 may be positioned under the first alignment electrode ALE1 so as to overlap an area of the first alignment electrode ALE1, and the second bank pattern BNP2 may be positioned under the second alignment electrode ALE2 so as to overlap an area of the second alignment electrode ALE2. The bank pattern BNP may have a structure that accurately defines (or defines) an alignment position of the light emitting elements LD in the emission area EMA of the pixel PXL together with the alignment electrodes ALE.

As the bank patterns BNP are provided under an area of each of the alignment electrodes ALE in the emission area EMA, each of the alignment electrodes ALE may protrude in an upper direction of the pixel PXL in the area where the bank patterns BNP is formed. Accordingly, the bank patterns BNP, which have wall structures, may be formed around the light emitting elements LD. For example, a wall structure may be formed in the emission area EMA to face the first and second ends EP1 and EP2 of the light emitting elements LD.

In an embodiment, in case that the bank patterns BNP and/or the alignment electrodes ALE include a reflective material, a reflective wall structure may be formed around the light emitting elements LD. Accordingly, as the light emitted from the light emitting elements LD is directed in the upper direction of the pixel PXL (for example, the image display direction of the display device DD), light output efficiency of the pixel PXL may be improved.

The alignment electrodes ALE may be positioned at least in the emission area EMA and may be spaced apart from each other along the first direction DR1 in the emission area EMA, and each of the alignment electrodes ALE may extend in the second direction DR2. The alignment electrodes ALE may include a first alignment electrode ALE1 and a second alignment electrode ALE2 arranged to be spaced apart from each other in the first direction DR1.

At least one of the first and second alignment electrodes ALE1 and ALE2 may be separated from another electrode (for example, the alignment electrode ALE provided to each of the adjacent pixels PXL in the second direction DR2) in the second opening OP2 (or an electrode separation area) of the first bank BNK1 after the light emitting elements LD are supplied and aligned in the pixel area PXA during a manufacturing process of the pixel PXL (or the device DD). For example, an end of the first alignment electrode ALE1 may be separated from the first alignment electrode ALE1 of the pixel PXL positioned above a corresponding pixel PXL in the second direction DR2 in the second opening OP2.

The first alignment electrode ALE1 may be electrically connected to the pixel circuit PXC described with reference to FIG. 4 through a first contact portion CNT1. The first contact portion CNT1 may be formed by removing a portion of at least one insulating layer positioned between the first alignment electrode ALE1 and the pixel circuit PXC, and an element of the pixel circuit PXC may be exposed by the first contact portion CNT1. The second alignment electrode ALE2 may be electrically connected to the second power line PL2 (or the second driving power VSS) described with reference to FIG. 4 through a second contact portion CNT2. The second contact portion CNT2 may be formed by removing a portion of at least one insulating layer positioned between the first alignment electrode ALE1 and the second power line PL2, and a portion of the second power line PL2 may be exposed by the second contact portion CNT2.

In an embodiment, the first contact portion CNT1 and the second contact portion CNT2 may be positioned in the non-emission area NEA to overlap the first bank BNK1. However, the disclosure is not limited thereto, and the first and second contact portions CNT1 and CNT2 may be positioned in the emission area EMA or in the second opening OP2 of the first bank BNK1 according to an embodiment.

The first alignment electrode ALE1 may be electrically connected to the first electrode PE1 through a first contact hole CH1 in the second opening OP2 of the first bank BNK1. The second alignment electrode ALE2 may be electrically connected to the second electrode PE2 through a second contact hole CH2 in the second opening OP2 of the first bank BNK1.

Each of the first alignment electrode ALE1 and the second alignment electrode ALE2 may receive a predetermined (or selectable) signal (or a predetermined alignment signal) from an alignment pad (not shown) positioned in the non-display area NDA in an alignment step of the light emitting elements LD. For example, the first alignment electrode ALE1 may receive a first alignment signal (or a first alignment voltage) from a first alignment pad, and the second alignment electrode ALE2 may receive a second alignment signal (or a second alignment voltage) from a second alignment pad. The above-described first and second alignment signals may be signals having a voltage difference and/or a phase difference of a degree that the light emitting elements LD may be aligned between the first and second alignment electrodes ALE1 and ALE2. At least one of the first and second alignment signals may be an AC signal, but is not limited thereto.

Each of the alignment electrodes ALE may be provided in a bar shape (or an "|" shape) having a constant width along the second direction DR2, but is not limited thereto. According to an embodiment, each alignment electrode ALE may or may not have a curved portion in the non-emission area NEA and/or the second opening OP2 of the first bank BNK1 which is the electrode separation area. A shape and/or a size of each of the alignment electrodes ALE in a remaining area other than the emission area EMA are/is not particularly limited and may be variously changed.

At least two light emitting elements LD (or tens of light emitting elements) may be aligned and/or provided in the emission area EMA (or the pixel area PXA), but the number of the light emitting elements LD is not limited thereto. According to an embodiment, the number of light emitting elements LD aligned and/or provided in the emission area EMA (or the pixel area PXA) may be variously changed.

Each of the light emitting elements LD may be disposed between the first alignment electrode ALE1 and the second alignment electrode ALE2. In a plan view, each of the light emitting elements LD may include the first end EP1 and the second end EP2 positioned at both ends (or facing each other) in a length direction thereof, for example, in the first direction DR1. In an embodiment, the second semiconductor layer (refer to "13" of FIG. 1) including p-type semiconductor layer may be positioned at the first end EP1 (or a p-type end), and a first semiconductor layer (refer to "11" of FIG. 1) including n-type semiconductor layer may be positioned at the second end EP2 (or an n-type end).

The light emitting elements LD may be disposed to be spaced apart from each other and may be aligned substantially parallel to each other. A distance the light emitting elements LD are spaced apart is not particularly limited. According to an embodiment, multiple light emitting elements LD may be disposed adjacent to each other to form a group, and other multiple light emitting elements LD may form another group to be spaced apart from the light emitting elements by a constant distance, may have non-uniform density, and may be aligned in a direction.

The light emitting elements LD may be input (or supplied) to the pixel area PXA (or the emission area EMA) through an inkjet printing method, a slit coating method, or other various methods. For example, the light emitting elements LD may be mixed with a volatile solvent and input (or supplied) to the pixel area PXA through an inkjet printing method, a slit coating method, or the like. In case that an alignment signal to each of the first alignment electrode ALE1 and the second alignment electrode ALE2 is applied, an electric field may be formed between the first alignment electrode ALE1 and the second alignment electrode ALE2. Accordingly, the light emitting elements LD may be aligned between the first alignment electrode ALE1 and the second alignment electrode ALE2. The light emitting elements LD may be stably aligned between the first alignment electrode ALE1 and the second alignment electrode ALE2 by volatilizing the solvent or removing the solvent in another method after the light emitting elements LD are aligned.

The electrodes PE (or pixel electrodes) may be provided at least in the emission area EMA, and each of the electrodes PE (or pixel electrodes) may be provided at a position corresponding to at least one alignment electrode ALE and the light emitting element LD. For example, each electrode PE may be formed on each alignment electrode ALE and the corresponding light emitting elements LD to overlap each alignment electrode ALE and the corresponding light emitting elements LD, and may be electrically connected to at least light emitting elements LD.

The electrodes PE may include the first electrode PE1 and the second electrode PE2 disposed to be spaced apart from each other.

The first electrode PE1 (the "first pixel electrode", or the "anode") may be formed on the first alignment electrode ALE1 and the first end EP1 of each of the light emitting elements LD to be electrically connected to the first end EP1 of each of the light emitting elements LD. The first electrode PE1 may directly or electrically contact the first alignment electrode ALE1 through the first contact hole CH1 at least in the non-emission area NEA, for example, in the second opening OP2 of the first bank BNK1 which is the electrode separation area, to be electrically and/or physically connected to the first alignment electrode ALE1. The first contact hole CH1 may be formed by removing a portion of at least one insulating layer positioned between the first electrode PE1 and the first alignment electrode ALE1, and a portion of the first alignment electrode ALE1 may be exposed by the first contact hole CH1. The first contact hole CH1, which is a connection point (or a contact point) between the first electrode PE1 and the first alignment electrode ALE1, may be positioned in the second opening OP2 of the first bank BNK1 which is the electrode separation area of the non-emission area NEA, but the disclosure is not limited thereto. According to an embodiment, a connection point (or a contact point) between the first electrode PE1 and the first alignment electrode ALE1 may be positioned in the emission area EMA of the pixel PXL.

The pixel circuit PXC, the first alignment electrode ALE1, and the first electrode PE1 may be electrically connected to each other through the first contact portion CNT1 and the first contact hole CH1.

According to the above-described embodiment, the first alignment electrode ALE1 and the first electrode PE1 may directly contact through the first contact hole CH1 to be connected, but the disclosure is not limited thereto. According to an embodiment, in order to prevent a defect due to a material property of the first alignment electrode ALE1, the first electrode PE1 may not directly contact the first alignment electrode ALE1 and may directly contact the pixel circuit PXC to be electrically connected to the pixel circuit PXC.

The first electrode PE1 may have a bar shape extending in the second direction DR2, but is not limited thereto. According to an embodiment, a shape of the first electrode PE1 may be variously changed within a range in which the first electrode PE1 is electrically and/or physically stably connected to the first end EP1 of the light emitting elements LD1. The shape of the first electrode PE1 may be variously changed in consideration of a disposition, a connection relationship, and the like with the first alignment electrode ALE1 disposed thereunder.

The second electrode PE2 (the "second pixel electrode", or the "cathode") may be formed on the second alignment electrode ALE2 and the second end EP2 of each of the light emitting elements LD to be electrically connected to the second end EP2 of each of the light emitting elements LD. The second electrode PE2 may directly contact the second alignment electrode ALE2 through the second contact hole CH2 to be electrically and/or physically connected to the second alignment electrode ALE2. The second contact hole CH2 may be formed by removing a portion of at least one insulating layer positioned between the second electrode PE2 and the second alignment electrode ALE2, and a portion of the second alignment electrode ALE2 may be exposed by the second contact hole CH2. According to an embodiment, the second contact hole CH2 which is a connection point (or a contact point) between the second electrode PE2 and the second alignment electrode ALE2 may be positioned in the second opening OP2 of the first bank BNK1 which is the electrode separation area of the non-emission area NEA, but the disclosure is not limited thereto. According to an embodiment, a connection point (or a contact point) between the second electrode PE2 and the second alignment electrode ALE2 may be positioned in the emission area EMA of the pixel PXL.

The second power line PL2, the second alignment electrode ALE2, and the second electrode PE2 may be electrically connected to each other through the second contact portion CNT2 and the second contact hole CH2.

In the above-described embodiment, the second alignment electrode ALE2 and the second electrode PE2 may directly contact through the second contact hole CH2 to be connected, but the disclosure is not limited thereto. According to an embodiment, in order to prevent a defect due to a material property of the second alignment electrode ALE2, the second electrode PE2 may not directly contact the second alignment electrode ALE2 and may directly contact the second power line PL2 to be electrically connected to the second power line PL2.

The second electrode PE2 may have a bar shape extending in the second direction DR2, but is not limited thereto. According to an embodiment, a shape of the second electrode PE2 may be variously changed within a range in which the second electrode PE2 is electrically and/or physically stably connected to the second end EP2 of the light emitting elements LD. The shape of the second electrode PE2 may be variously changed in consideration of a disposition, a connection relationship, and the like with the second alignment electrode ALE2 disposed thereunder.

Hereinafter, a stack structure of the pixel PXL according to the above-described embodiment is described with reference to FIGS. 6 to 10.

Figure 6:
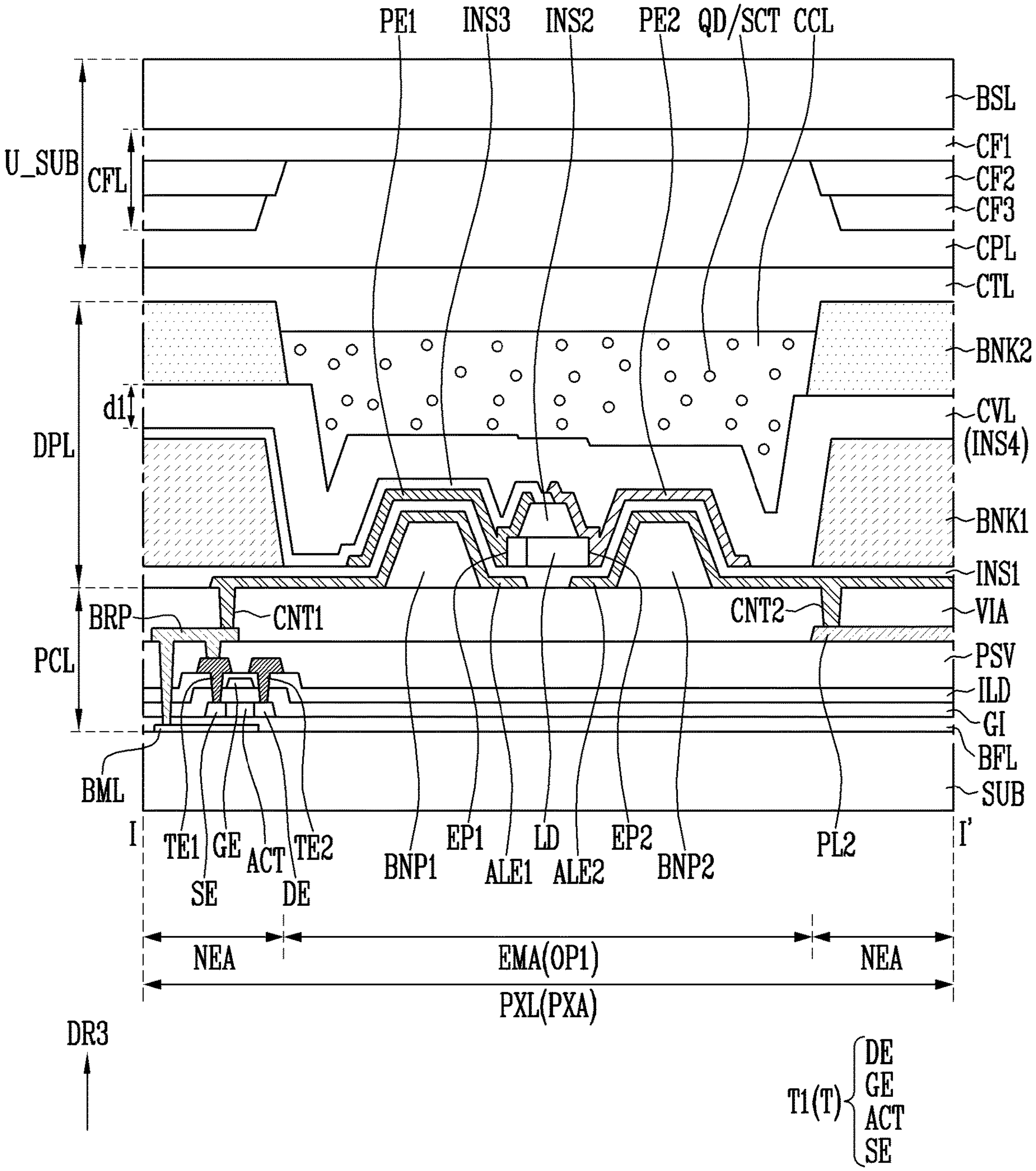
FIG. 6 is a schematic cross-sectional view taken along line I~I' of FIG. 5.
Figure 7:
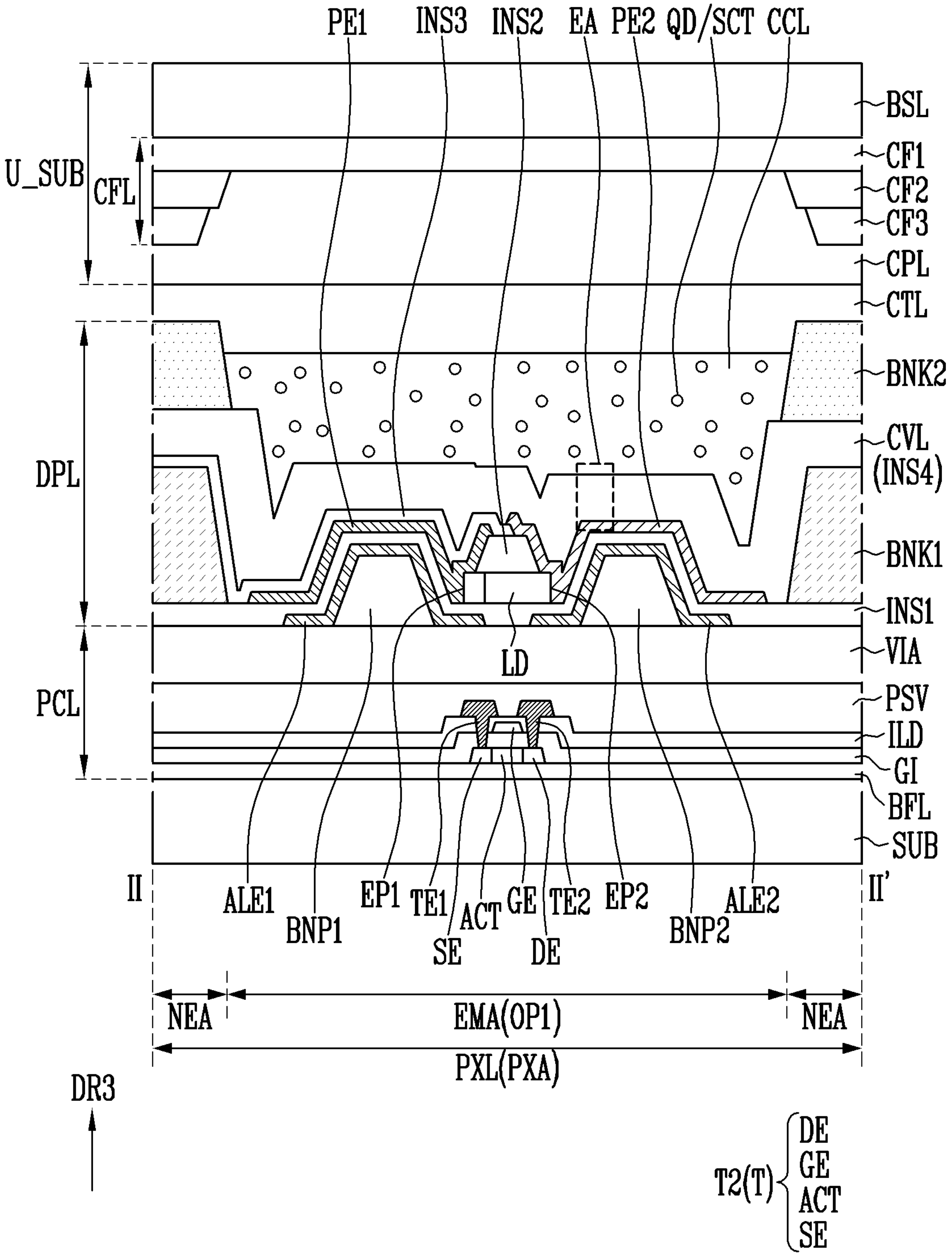
FIG. 7 is a schematic cross-sectional view taken along line II~II' of FIG. 5.
Figure 8:
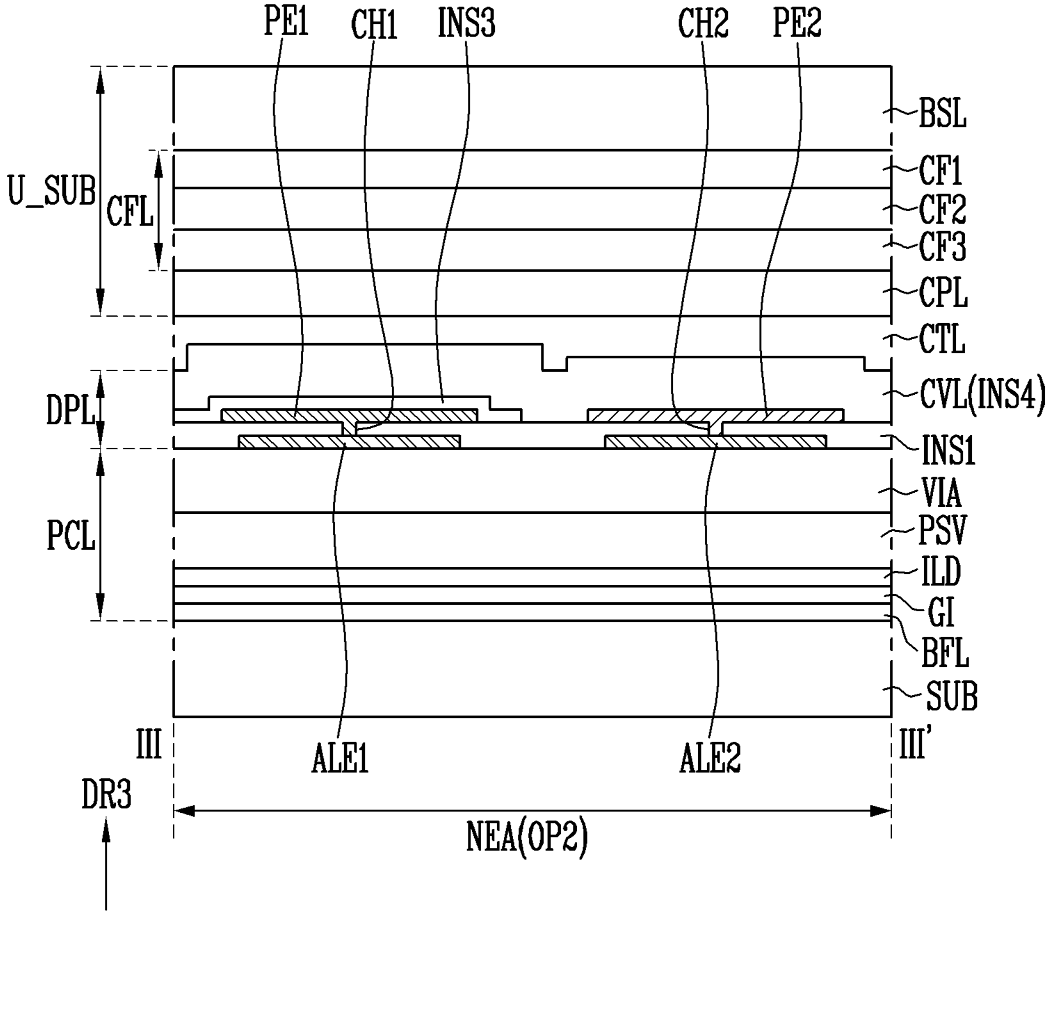
FIG. 8 is a schematic cross-sectional view taken along line III~III' of FIG. 5.
Figure 9:
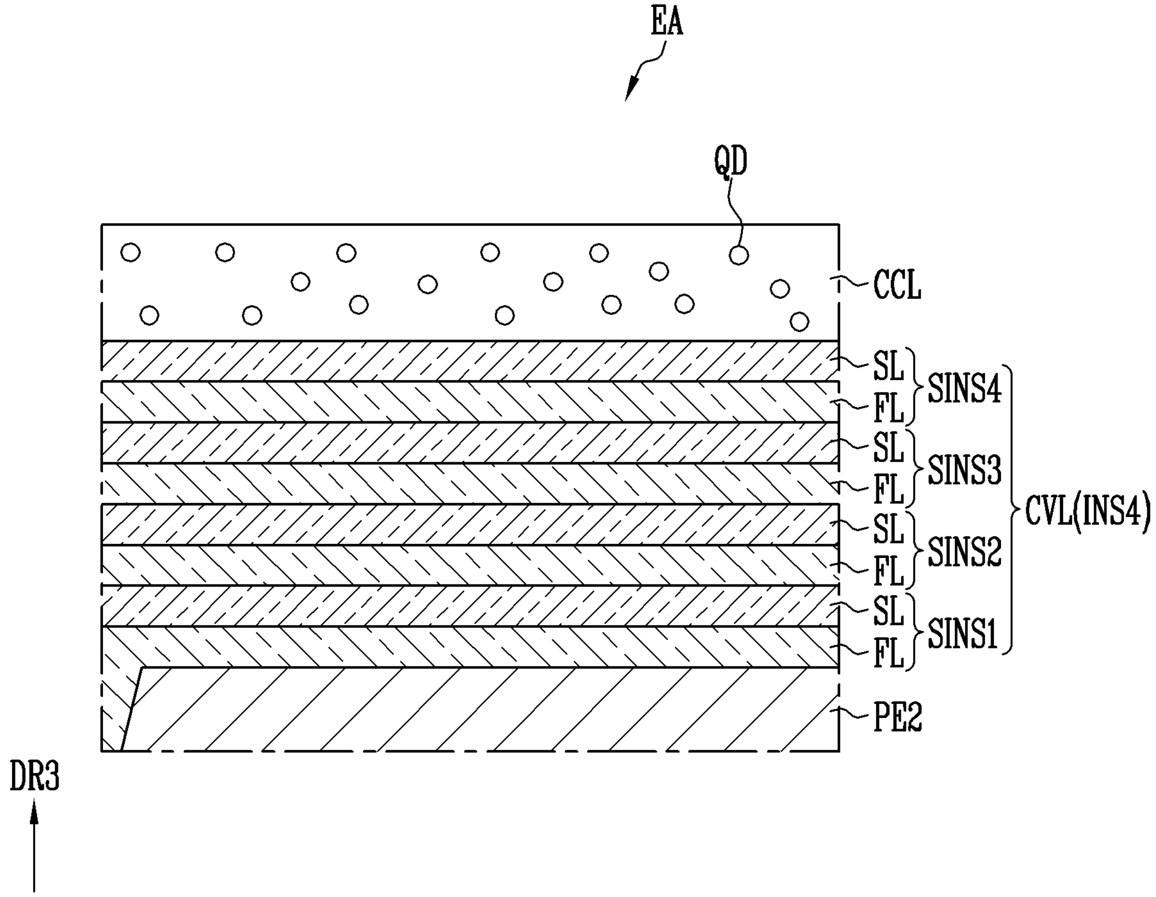
FIG. 9 is a schematic enlarged views illustrating portion EA of FIG. 7.
Figure 10:
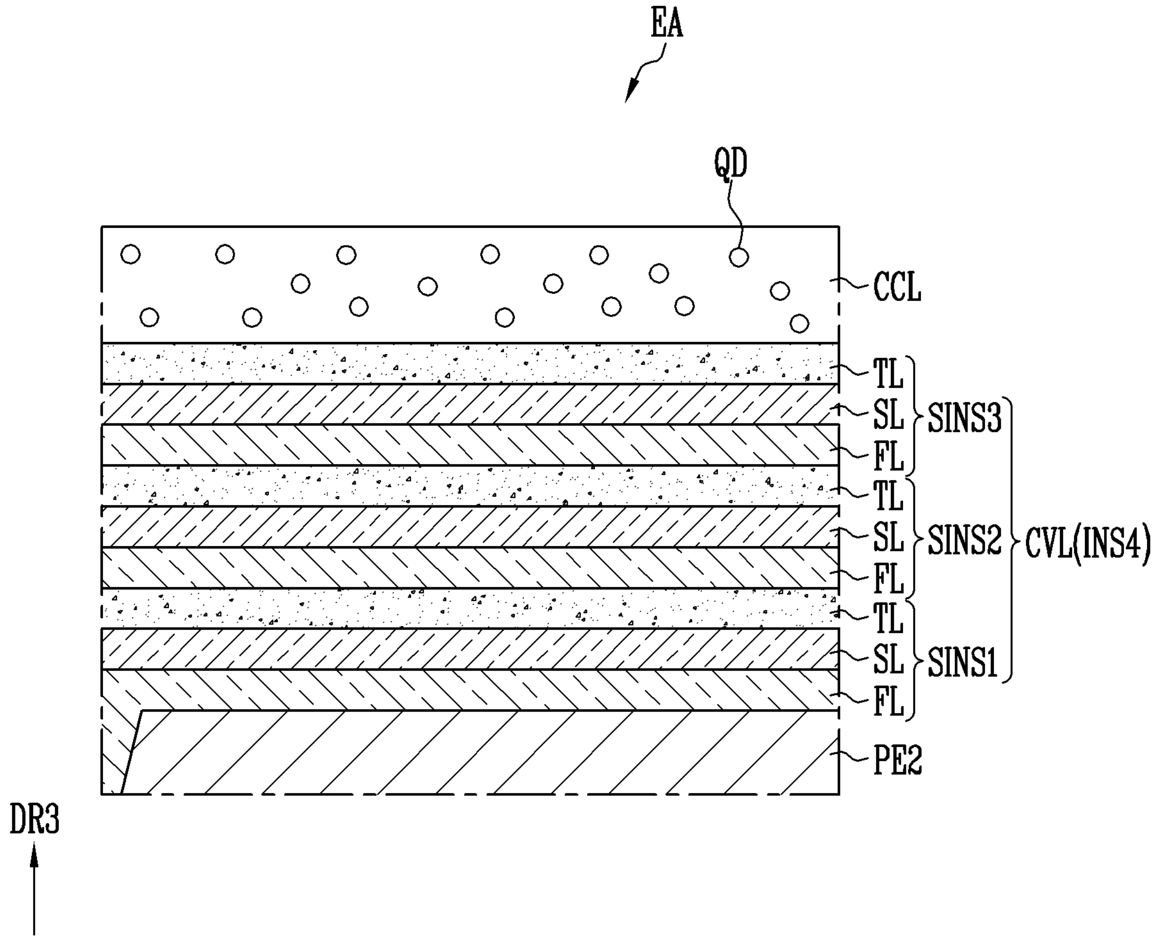
FIG. 10 is a schematic enlarged view illustrating portion EA portion of FIG. 7.

FIG. 6 is a schematic cross-sectional view taken along line I~I' of FIG. 5, FIG. 7 is a schematic cross-sectional view taken along line II~II' of FIG. 5, FIG. 8 is a schematic cross-sectional view taken along line III~III' of FIG. 5, and FIGS. 9 and 10 are schematic enlarged views illustrating portion EA of FIG. 7.

FIG. 10 illustrates a modified embodiment of an embodiment of FIG. 9 regarding a cover layer CVL and the like.

In FIGS. 6 to 10, the stack structure of the pixel PXL is simplified, such as showing each electrode as a single layer of electrode and each insulating layer as only a single layer of insulating layer, but is not limited thereto.

In order to avoid an overlapping description regarding the embodiments of FIGS. 6 to 10, a point different from the above-described embodiment is described.

Referring to FIGS. 1 to 10, the pixel PXL may include a substrate SUB, a pixel circuit layer PCL, and a display element layer DPL.

The pixel circuit layer PCL and the display element layer DPL may be disposed to overlap each other in the third direction DR3 on a surface of the substrate SUB. For example, the display area DA of the substrate SUB may include the pixel circuit layer PCL disposed on a surface of the substrate SUB and the display element layer DPL disposed on the pixel circuit layer PCL. However, an arrangement of the pixel circuit layer PCL and the display element layer DPL on the substrate SUB may vary according to an embodiment. In case that the pixel circuit layer PCL and the display element layer DPL are separated and overlapped as separate layers, each layout space for forming the pixel circuit PXC and the emission component EMU in each layer may be sufficiently secured.

The substrate SUB may include a transparent insulating material to transmit light. The substrate SUB may be a rigid substrate or a flexible substrate.

In each pixel area PXA of the pixel circuit layer PCL, circuit elements (for example, transistors T) configuring the pixel circuit PXC of the corresponding pixel PXL and signal lines electrically connected to the circuit element may be disposed. In each pixel area PXA of the display element layer DPL, the alignment electrodes ALE, the light emitting elements LD, and/or the electrodes PE configuring the emission component EMU of the corresponding pixel PXL may be disposed.

The pixel circuit layer PCL may include at least one insulating layer in addition to the circuit elements and the signal lines. For example, the pixel circuit layer PCL may include a buffer layer BFL, a gate insulating layer GI, an interlayer insulating layer ILD, a passivation layer PSV, and a via layer VIA sequentially stacked on the substrate SUB along the third direction DR3.

The buffer layer BFL may be entirely disposed on the substrate SUB. The buffer layer BFL may prevent an impurity from diffusing into the transistors included in the pixel circuit PXC. The buffer layer BFL may be an inorganic insulating layer including an inorganic material. The buffer layer BFL may include at least one of silicon nitride ($SiN_x$), silicon oxide ($SiO_x$), silicon oxynitride ($SiO_xN_y$), and aluminum oxide ($AlO_x$). The buffer layer BFL may be provided as a single layer, or may be provided as multiple layers of at least double layers. In case that the buffer layer BFL is provided as multiple layers, each layer may be formed of the same material or may be formed of different materials. The buffer layer BFL may be omitted depending on a material, a process condition, and the like of the substrate SUB.

The gate insulating layer GI may be entirely disposed on the buffer layer BFL. The gate insulating layer GI may include the same material as the above-described buffer layer BFL or may include a material that may be used for the buffer layer BFL. For example, the gate insulating layer GI may be an inorganic insulating layer including an inorganic material.

The interlayer insulating layer ILD may be entirely provided and/or formed on the gate insulating layer GI. The interlayer insulating layer ILD may include the same material as the buffer layer BFL or may include one or more materials that may be used for the buffer layer BFL.

The passivation layer PSV may be entirely provided and/or formed on the interlayer insulating layer ILD. The passivation layer PSV may include the same material as the buffer layer BFL or may include one or more materials that may be used for the buffer layer BFL.

The via layer VIA may be entirely provided and/or formed on the passivation layer PSV. The via layer VIA may be an inorganic insulating layer including an inorganic material or an organic insulating layer including an organic material. The inorganic insulating layer may include, for example, at least one of silicon oxide ($SiO_x$), silicon nitride ($SiN_x$), silicon oxynitride ($SiO_xN_y$), and aluminum oxide ($AlO_x$). The organic insulating layer may include, for example, at least one of an acrylic resin (polyacrylates resin), an epoxy resin, a phenolic resin, a polyamide resin, a polyimide resin, an unsaturated polyester resin, a poly-phenylene ethers resin, a poly-phenylene sulfides resin, and a benzocyclobutene resin.

In an embodiment, the via layer VIA may be used as a planarization layer for alleviating a step difference generated by the configurations of the pixel circuit PXC positioned under the via layer PCL in the pixel circuit layer PCL.

The pixel circuit layer PCL may include at least one conductive layer disposed between the above-described insulating layers. For example, the pixel circuit layer PCL may include a first conductive layer disposed between the substrate SUB and the buffer layer BFL, a second conductive layer disposed on the gate insulating layer GI, a third conductive layer disposed on the interlayer insulating layer ILD, and a fourth conductive layer disposed on the passivation layer PSV. However, the insulating layers and the conductive layers are not limited to the above-described embodiment, and according to an embodiment, another insulating layer and another conductive layer in addition to the insulating layer and the conductive layers may be provided in the pixel circuit layer PCL.

The first conductive layer may be formed in a single layer including copper (Cu), molybdenum (Mo), tungsten (W), aluminum neodymium (AlNd), titanium (Ti), aluminum (Al), silver (Ag), or an alloy thereof alone or a mixture thereof, or may be formed in a double layer or multiple layer including molybdenum (Mo), titanium (Ti), copper (Cu), aluminum (Al), or silver (Ag), which is a low-resistance material to reduce a line resistance. Each of the second to fourth conductive layers may include the same material as the first conductive layer or may include one or more materials that may be used for the first conductive layer, but is not limited thereto.

The pixel circuit PXC disposed in the pixel circuit layer PCL may include at least one transistor T. For example, the pixel circuit PXC may include a first transistor T1 and a second transistor T2 electrically connected to the first transistor T1. However, the disclosure is not limited thereto, and the pixel circuit PXC may further include circuit elements performing another function in addition to the first transistor T1 and the second transistor T2. The first transistor T1 may have the same configuration as the first transistor T1 described with reference to FIG. 4, and the second transistor T2 may have the same configuration as the second transistor T2 described with reference to FIG. 4. In the following embodiment, in case that the first transistor T1 and the second transistor T2 are collectively referred to, the first transistor T1 and the second transistor T2 are referred to as a transistor T or transistors T.

The transistors T may include a semiconductor pattern and a gate electrode GE overlapping at least a portion of the semiconductor pattern in the third direction DR3. The semiconductor pattern may include a channel area ACT, a first contact area SE, and a second contact area DE. The first contact area SE may be a source area, and the second contact area DE may be a drain area.

The gate electrode GE may be provided and/or formed on the gate insulating layer GI to correspond to the channel area ACT of the semiconductor pattern. For example, the gate electrode GE may be disposed in the second conductive layer positioned between the gate insulating layer GI and the interlayer insulating layer ILD. The gate electrode GE may be provided on the gate insulating layer GI to overlap the channel area ACT of the semiconductor pattern.

The semiconductor pattern may be provided and/or formed on the buffer layer BFL. The channel area ACT, the first contact area SE, and the second contact area DE may be a semiconductor pattern formed of poly silicon, amorphous silicon, an oxide semiconductor, or the like. The channel area ACT, the first contact area SE, and the second contact area DE may be formed of a semiconductor layer that is not doped with an impurity or is doped with an impurity. For example, the first contact area SE and the second contact area DE may be formed of a semiconductor layer doped with an impurity, and the channel area ACT may be formed of a semiconductor layer that is not doped with an impurity. As an impurity, for example, an n-type impurity may be used, but is not limited thereto.

The channel area ACT may overlap the gate electrode GE of the corresponding transistor T in the third direction DR3. For example, the channel area ACT of the first transistor T1 may overlap the gate electrode GE of the first transistor T1, and the channel area ACT of the second transistor T2 may overlap the gate electrode GE of the second transistor T2.

The first contact area SE of the first transistor T1 may be connected to (or in contact with) an end of the channel area ACT of the first transistor T1. The first contact area SE of the first transistor T1 may be connected to a bridge pattern BRP through a first connection member TE1.

The first connection member TE1 may be provided and/or formed on the interlayer insulating layer ILD. For example, the first connection member TE1 may be disposed in the third conductive layer. An end of the first connection member TE1 may be electrically and/or physically connected to the first contact area SE of the first transistor T1 through a contact hole sequentially passing through the interlayer insulating layer ILD and the gate insulating layer GI. Another end of the first connection member TE1 may be electrically and/or physically connected to the bridge pattern BRP through a contact hole passing through the passivation layer PSV positioned on the interlayer insulating layer ILD.

The bridge pattern BRP may be provided and/or formed on the passivation layer PSV. For example, the bridge pattern BRP may be disposed in the fourth conductive layer. An end of the bridge pattern BRP may be connected to the first contact area SE of the first transistor T1 through the first connection member TEL Another end of the bridge pattern BRP may be electrically and/or physically connected to a lower metal layer BML through a contact hole sequentially passing through the passivation layer PSV, the interlayer insulating layer ILD, the gate insulating layer GI, and the buffer layer BFL. The lower metal layer BML and the first contact area SE of the first transistor T1 may be electrically connected to each other through the bridge pattern BRP and the first connection member TE1.

According to an embodiment, the bridge pattern BRP may be electrically connected to an element in the display element layer DPL, for example, the first alignment electrode ALE1 through a contact hole passing through the via layer VIA.

The lower metal layer BML may be disposed in the first conductive layer provided on the substrate SUB. The lower metal layer BML may be electrically connected to the first transistor T1 to expand a driving range of a voltage supplied to the gate electrode GE of the first transistor T1. For example, the lower metal layer BML may be electrically connected to the first contact area SE of the first transistor T1 to stabilize the channel area ACT of the first transistor T1. As the lower metal layer BML is electrically connected to the first contact area SE of the first transistor T1, floating of the lower metal layer BML may be prevented.

The second contact area DE of the first transistor T1 may be connected to (or in contact with) another end of the channel area ACT of the first transistor T1. The second contact area DE of the first transistor T1 may be connected to (or in contact with) a second connection member TE2.

The second connection member TE2 may be provided and/or formed on the interlayer insulating layer ILD. For example, the second connection member TE2 may be disposed in the third conductive layer. An end of the second connection member TE2 may be electrically and/or physically connected to the second contact area DE of the first transistor T1 through a contact hole passing through the interlayer insulating layer ILD and the gate insulating layer GI.

The first contact area SE of the second transistor T2 may be connected to (or in contact with) an end of the channel area ACT of the second transistor T2. Although not directly shown in the drawing, the first contact area SE of the second transistor T2 may be electrically connected to the gate electrode GE of the first transistor T1. For example, the first contact area SE of the second transistor T2 may be electrically connected to the gate electrode GE of the first transistor T1 through another first connection member TE1. The other first connection member TE1 may be provided and/or formed on the interlayer insulating layer ILD. For example, the other first connection member TE1 may be disposed in the third conductive layer.

The second contact area DE of the second transistor T2 may be connected to (or in contact with) another end of the channel area ACT of the second transistor T2. Although not directly shown in the drawing, the second contact area DE of the second transistor T2 may be electrically connected to the data line Dj. For example, the second contact area DE of the second transistor T2 may be electrically connected to the data line Dj through another second connection member TE2. The other second connection member TE2 may be provided and/or formed on the interlayer insulating layer ILD. For example, the other second connection member TE2 may be disposed in the third conductive layer.

In the above-described embodiment, a case in which the transistors T are thin film transistors having a top gate structure is described as an example, but the disclosure is not limited thereto, and structures of the transistors T may be variously changed.

The passivation layer PSV may be provided and/or formed on the transistors T and the first and second connection members TE1 and TE2.

The pixel circuit layer PCL may include a power line provided and/or formed on the passivation layer PSV. For example, the pixel circuit layer PCL may include the second power line PL2 disposed on the passivation layer PSV. The second power line PL2 may be disposed in the fourth conductive layer. The voltage of the second driving power VSS may be applied to the second power line PL2. Although not directly shown in FIGS. 6 to 10, the pixel circuit layer PCL may further include the first power line PL1 described with reference to FIG. 4. The first power line PL1 may be formed in the same process as the second power line PL2 and provided on the same layer as the second power line PL2 or may be formed in a process different from that of the second power line PL2 and provided on a layer different from that of the second power line PL2. However, the disclosure is not limited thereto.

The via layer VIA may be provided and/or formed on the bridge pattern BRP and the second power line PL2. The via layer VIA may be partially opened to include the first contact portion CNT1 exposing a portion of the bridge pattern BRP and the second contact portion CNT2 exposing a portion of the second power line PL2.

The display element layer DPL may be provided and/or formed on the via layer VIA.

The display element layer DPL may include the bank patterns BNP, the alignment electrodes ALE, the first bank BNK1, the light emitting elements LD, and the electrodes PE.

The bank patterns BNP may be positioned on the via layer VIA. For example, the bank patterns BNP may protrude in the third direction DR3 on a surface of the via layer VIA. Accordingly, an area of the alignment electrodes ALE disposed on the bank patterns BNP may protrude in the third direction DR3 (or a thickness direction of the substrate SUB).

The bank pattern BNP may include an inorganic insulating layer including an inorganic material or an organic insulating layer including an organic material. According to an embodiment, the bank pattern BNP may include a single layer of inorganic insulating layer and/or a single layer of organic insulating layer, but is not limited thereto. According to an embodiment, the bank pattern BNP may be provided in a form of multiple layers in which at least one organic insulating layer and at least one inorganic insulating layer are stacked each other. However, a material of the bank pattern BNP is not limited to the above-described embodiment, and the bank pattern BNP may include a conductive material (or substance) according to an embodiment.

The bank pattern BNP may include a first bank pattern BNP1 and a second bank pattern BNP2. The first bank pattern BNP1 may be positioned under the first alignment electrode ALE1 at least in the emission area EMA and overlap the first alignment electrode ALE1 in the third direction DR3, and the second bank pattern BNP2 may be positioned under the second alignment electrode ALE2 at least in the emission area EMA and overlap the second alignment electrode ALE2 in the third direction DR3.

The bank pattern BNP may have a trapezoidal shape in a cross-sectional view of which a width becomes narrower from a surface (for example, an upper surface) of the via layer VIA toward an upper portion along the third direction DR3, but is not limited thereto. According to an embodiment, the bank pattern BNP may have a semi-elliptical shape, a semi-circular shape (or a semi-spherical shape), or the like in a cross-sectional view of which a width becomes narrower from the surface of the via layer VIA toward an upper portion along the third direction DR3. However, a shape of the bank pattern BNP in a cross-sectional view is not limited to the above-described embodiment and may be variously changed within a range capable of improving efficiency of light emitted from each of the light emitting elements LD. According to an embodiment, at least one of the bank patterns BNP may be omitted or a position thereof may be changed.

The bank pattern BNP may be used as a reflective member. For example, the bank pattern BNP may be used as a reflective member that guides the light emitted from each light emitting element LD in the image display direction of the display device DD together with the alignment electrode ALE disposed thereon to improve light output efficiency of the pixel PXL.

The alignment electrodes ALE may be positioned on the bank pattern BNP.

The alignment electrodes ALE may be disposed on the same layer and may have the same thickness in the third direction DR3. The alignment electrodes ALE may be simultaneously formed in the same process.

The alignment electrodes ALE may be formed of a material having a reflectance in order to allow the light emitted from the light emitting elements LD to proceed in the image display direction (or a front surface direction) of the display device DD. For example, the alignment electrodes ALE may be formed of a conductive material (or substance). The conductive material may include an opaque metal suitable for reflecting the light emitted from the light emitting elements LD in the image display direction of the display device DD. The opaque metal may include, for example, a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. However, the material of the alignment electrodes ALE is not limited to the above-described embodiment. According to an embodiment, the alignment electrodes ALE may include a transparent conductive material (or substance). The transparent conductive material (or substance) may include a conductive oxide such as indium tin oxide (ITO), indium zinc oxide (IZO), zinc oxide ($ZnO_x$), indium gallium zinc oxide (IGZO), and indium tin zinc oxide (ITZO), a conductive polymer such as poly(3,4-ethylenedioxythiophene) (PEDOT), and the like. In case that the alignment electrodes ALE include a transparent conductive material (or substance), a separate conductive layer formed of an opaque metal for reflecting the light emitted from the light emitting elements LD in the image display direction of the display device DD may be added. However, the material of the alignment electrodes ALE is not limited to the above-described materials.

Each of the alignment electrodes ALE may be provided and/or formed as a single layer, but is not limited thereto. According to an embodiment, each of the alignment electrodes ALE may be provided and/or formed as multiple layers in which at least two or more of metals, alloys, conductive oxides, and conductive polymers are stacked each other. Each of the alignment electrodes ALE may be formed as multiple layers of at least double layers in order to minimize distortion due to a signal delay when transmitting a signal (or a voltage) to both ends of each of the light emitting elements LD, for example, the first and second ends EP1 and EP2. For example, each of the alignment electrodes ALE may be formed as multiple layers including at least one of a reflective electrode layer, a transparent electrode layer disposed on and/or under the reflective electrode layer, and a conductive capping layer covering an upper portion of the reflective electrode layer and/or the transparent electrode layer.

As described above, in case that the alignment electrodes ALE are formed of a conductive material having a reflectance, the light emitted from both ends of each of the light emitting elements LD, for example, the first and second ends EP1 and EP2 may proceed in the image display direction of the display device DD.

The first alignment electrode ALE1 may be electrically connected to the first transistor T1 of the pixel circuit layer PCL through the first contact portion CNT1, and the second alignment electrode ALE2 may be electrically connected to the second power line PL2 of the pixel circuit layer PCL through the second contact portion CNT2.

A first insulating layer INS1 may be provided and/or formed on the alignment electrodes ALE.

The first insulating layer INS1 may be disposed on the alignment electrodes ALE and the via layer VIA. The first insulating layer INS1 may be partially opened at least in the non-emission area NEA to expose configurations positioned thereunder. For example, the first insulating layer INS1 may be partially opened to include the first contact hole CH1 exposing a portion of the first alignment electrode ALE1 by removing at least an area at least in the non-emission area NEA and the second contact hole CH2 exposing a portion of the second alignment electrode ALE2 by removing another area at least in the non-emission area NEA. The at least non-emission area NEA may be the second opening OP2 of the first bank BNK1 which is the electrode separation area, but is not limited thereto.

The first insulating layer INS1 may be formed of an inorganic insulating layer formed of an inorganic material. For example, the first insulating layer INS1 may be formed of an inorganic insulating layer suitable for protecting the light emitting elements LD from the pixel circuit layer PCL. For example, the first insulating layer INS1 may include at least one of silicon nitride ($SiN_x$), silicon oxide ($SiO_x$), silicon oxynitride ($SiO_xN_y$), and a metal oxide such as aluminum oxide ($AlO_x$). The first insulating layer INS1 may have a profile (or surface) corresponding to a profile of configurations positioned thereunder. An empty gap (or a separation space) may exist between each of the light emitting elements LD and the first insulating layer INS1. According to an embodiment, the first insulating layer INS1 may be formed of an organic insulating layer formed of an organic material.

The first insulating layer INS1 may be provided as a single layer or multiple layers. In case that the first insulating layer INS1 is provided as the multiple layers, the first insulating layer INS1 may be provided as a distributed Bragg reflectors (DBR) structure in which a first inorganic layer and a second inorganic layer having different refractive indices are alternately stacked each other.

The first insulating layer INS1 may be entirely disposed over the emission area EMA and the non-emission area NEA of each pixel PXL, but is not limited thereto. According to an embodiment, the first insulating layer INS1 may be positioned only in a specific area of each pixel PXL, for example, the emission area EMA.

The first bank BNK1 may be disposed on the first insulating layer INS1.

The first bank BNK1 may be disposed on the first insulating layer INS1 at least in the non-emission area NEA, but is not limited thereto. The first bank BNK1 may configure a pixel defining layer that is formed between adjacent pixels PXL so as to surround the emission area EMA of each pixel PXL to partition (or define) the emission area EMA of the corresponding pixel PXL. The first bank BNK1 may have a dam structure that prevents a solution (or an ink) in which the light emitting elements LD are mixed from flowing into the emission area EMA of the adjacent pixels PXL or controls so that a certain amount of solution is supplied to each emission area EMA.

The above-described first bank BNK1 and bank pattern BNP may be formed in different processes and provided on different layers, but are not limited thereto. According to an embodiment, the first bank BNK1 and the bank pattern BNP may be formed in different processes and provided on the same layer, or may be formed in the same process and provided on the same layer.

The light emitting elements LD may be supplied and aligned in the emission area EMA of the pixel PXL in which the first insulating layer INS1 and the first bank BNK1 are formed. For example, the light emitting elements LD may be supplied (or input) to the emission area EMA through an inkjet printing method or the like, and the light emitting elements LD may be aligned between the alignment electrodes ALE by an electric field formed by a predetermined (or selectable) signal (or an alignment signal) applied to each of the alignment electrodes ALE. For example, the light emitting elements LD may be aligned on the first insulating layer INS1 between the first alignment electrode ALE1 and the second alignment electrode ALE2.

A second insulating layer INS2 (or an insulating pattern) may be disposed on each of the light emitting elements LD. The second insulating layer INS2 may be positioned on the light emitting elements LD and may partially cover an outer circumferential surface (or a surface) of each of the light emitting elements LD to expose the first end EP1 and the second end EP2 of each of the light emitting elements LD.

The second insulating layer INS2 may include an inorganic insulating layer or an organic insulating layer including an inorganic material. For example, the second insulating layer INS2 may include an inorganic insulating layer suitable for protecting the active layer 12 of each of the light emitting elements LD from external oxygen and moisture. However, the disclosure is not limited thereto, and the second insulating layer INS2 may be formed of an organic insulating layer including an organic material according to a design condition or the like of the display device DD (or the display panel DP) to which the light emitting elements LD are applied. The second insulating layer INS2 may be configured as a single layer or multiple layers.

In case that a gap exists between the first insulating layer INS1 and the light emitting elements LD before formation of the second insulating layer INS2, the gap may be filled with the second insulating layer INS2 in a process of forming the second insulating layer INS2.

By forming the second insulating layer INS2 on the light emitting elements LD of which an alignment is completed in the emission area EMA of each pixel PXL, the light emitting elements LD may be prevented from being separated from an aligned position.

The electrodes PE may be formed on both ends of the light emitting elements LD that are not covered by the second insulating layer INS2, for example, on the first and second ends EP1 and EP2. The electrodes PE may include the first electrode PE1 and the second electrode PE2.

At least in the emission area EMA, the first electrode PE1 may be disposed on the first end EP1 of each of the light emitting elements LD and the first insulating layer INS1 on the first alignment electrode ALE1. The first electrode PE1 may be connected to the first alignment electrode ALE1 through the first contact hole CH1 of the first insulating layer INS1. The second electrode PE2 may be connected to the second alignment electrode ALE2 through the second contact hole CH2 of the first insulating layer INS1.

The first electrode PE1 may be disposed directly on the first end EP1 of the light emitting elements LD to be in contact with the first end EP1 of the light emitting elements LD. The second electrode PE2 may be disposed directly on the second end EP2 of the light emitting elements LD to be in contact with the second end EP2 of the light emitting elements LD. The first electrode PE1 and the second electrode PE2 may be formed in different processes.

A third insulating layer INS3 may be disposed on the first electrode PE1, and the second electrode PE2 may be disposed on the third insulating layer INS3.

The third insulating layer INS3 may be positioned on the first electrode PE1 to cover the first electrode PE1 (or so as not to expose the first electrode PE1 to the outside), thereby preventing corrosion or the like of the first electrode PE1. The third insulating layer INS3 may include an inorganic insulating layer formed of an inorganic material or an organic insulating layer formed of an organic material. For example, the third insulating layer INS3 may include at least one of silicon nitride ($SiN_x$), silicon oxide ($SiO_x$), silicon oxynitride ($SiO_xN_y$), and a metal oxide such as aluminum oxide ($AlO_x$), but is not limited thereto. The third insulating layer INS3 may be formed as a single layer or multiple layers.

As described above, in case that the third insulating layer INS3 is disposed between the first electrode PE1 and the second electrode PE2, since the first electrode PE1 and the second electrode PE2 may be stably separated by the third insulating layer INS3, electrical stability between the first and second ends EP1 and EP2 of the light emitting elements LD may be secured.

Each of the electrodes PE may be formed of various transparent conductive materials. For example, each of the electrodes PE may include at least one of various transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and may be implemented to be substantially transparent or translucent to satisfy a predetermined (or selectable) light transmittance. Accordingly, the light emitted from the first and second ends EP1 and EP2 of the light emitting elements LD may pass through the electrodes PE and may be emitted to the outside of the display device DD (or the display panel DP).

In an embodiment, a cover layer CVL may be disposed on the above-described electrodes PE and third insulating layer INS3.

The cover layer CVL may be a fourth insulating layer INS4 that flattens an upper surface of the display element layer DPL while protecting the electrodes PE. The cover layer CVL may change a path of light lost among light (or rays) emitted from the color conversion layer CCL to the front surface direction (or the image display direction of the display device DD) using a refractive index difference, thereby improving a front surface light output luminance. The cover layer CVL may recycle light that did not react with the color conversion layer CCL (for example, blue-based light) to react with the color conversion layer CCL, thereby increasing a light output luminance of the color conversion layer CCL.

In an embodiment, the cover layer CVL may be configured to selectively reflect light of a specific wavelength range. The cover layer CVL may be configured to pass light of a first wavelength among light proceeding in a rear surface direction of the color conversion layer CCL and reflect light of a wavelength different from the first wavelength. For example, the cover layer CVL may pass blue-based light proceeding from the color conversion layer CCL in the rear surface direction thereof, for example, in a direction of the light emitting elements LD, and reflect green-based light and/or red-based light other than the blue-based light to the color conversion layer CCL.

The cover layer CVL may include at least one or more sub-insulating layers including a first layer FL and a second layer SL sequentially stacked and having different refractive indices. For example, the cover layer CVL may include first, second, third, and fourth sub-insulating layers SINS1, SINS2, SINS3, and SINS4 as shown in FIG. 9. Each of the first, second, third, and fourth sub-insulating layers SINS1, SINS2, SINS3, and SINS4 may include a first layer FL and a second layer SL sequentially stacked along the third direction DR3.

The first layer FL may include a first inorganic layer having a first refractive index, and the second layer SL may include a second inorganic layer having a second refractive index different from the first refractive index. The first refractive index may be less than the second refractive index. The first layer FL may be a first inorganic layer including silicon oxide ($SiO_x$), and the second layer SL may be a second inorganic layer including silicon nitride ($SiN_x$). For example, the first layer FL may be a first inorganic layer including silicon oxide ($SiO_x$) having a first refractive index of about 1.53, and the second layer SL may be a second inorganic layer including silicon nitride $SiN_x$ having a second refractive index of about 1.81. The first layer FL may have a thickness of about 1060 Å±5%, and the second layer SL may have a thickness of about 900 Å±5%, but are not limited thereto.

The above-described cover layer CVL may include a DBR structure in which the first layer FL having the first refractive index and the second layer SL having the second refractive index are alternately and repeatedly stacked each other. For example, the cover layer CVL may include at least one sub-insulating layer in which the first layer FL having the first refractive index and the second layer SL having the second refractive index are stacked each other.

According to an embodiment, the first refractive index may be greater than the second refractive index. The first layer FL may be a first inorganic layer including silicon nitride ($SiN_x$), and the second layer SL may be a second inorganic layer including silicon oxide ($SiO_x$).

In the above-described embodiment, the cover layer CVL may include at least one or more sub-insulating layers sequentially stacked and including the first layer FL and the second layer SL having different refractive indices, but is not limited thereto. According to an embodiment, the cover layer CVL may include at least one or more sub-insulating layers SINS1, SINS2, and SINS3 including a first layer FL, a second layer SL, and a third layer TL having a refractive index different from that of an adjacent layer as shown in FIG. 10. For example, the cover layer CVL may include a first sub-insulating layer SINS1, a second sub-insulating insulating layer SINS2, and a third sub-insulating insulating layer SINS3 sequentially stacked on the electrodes PE2 along the third direction DR3.

The first layer FL may include a first inorganic layer having a first refractive index, the second layer SL may include a second inorganic layer having a second refractive index different from the first refractive index, and the third layer TL may include a third inorganic layer having a third refractive index different from the second refractive index. The third refractive index may be same as the first refractive index, but is not limited thereto.

In case that the first refractive index and the third refractive index are less than the second refractive index, the first layer FL may be a first inorganic layer including silicon oxide ($SiO_x$), the second layer SL may be a second inorganic layer including silicon nitride ($SiN_x$), and the third layer TL may be a third inorganic layer including silicon oxide ($SiO_x$).

According to an embodiment, in case that the first refractive index and the third refractive index are greater than the second refractive index, the first layer FL may be a first inorganic layer including silicon nitride ($SiN_x$), the second layer SL may be a second inorganic layer including silicon oxide ($SiO_x$), and the third layer TL may be a third inorganic layer including silicon nitride ($SiN_x$).

The cover layer CVL shown in FIG. 10 may have a structure in which the first layer FL having the first refractive index, the second layer SL having the second refractive index, and the third layer TL having the third refractive index are alternately and repeatedly stacked each other. For example, the cover layer CVL may include at least one sub-insulating layer configured by stacking the first layer FL having the first refractive index, the second layer SL having the second refractive index, and the third layer TL having the third refractive index.

The above-described cover layer CVL may transmit a portion of light proceeding in the rear surface direction of the color conversion layer CCL and reflect the rest. As described above, as the first layer FL and the second layer SL having different refractive indices are alternately stacked each other to configure the cover layer CVL, a refractive index difference may be repeatedly formed in the cover layer CVL, and thus light incident on the cover layer CVL may have different transmittance according to an incident angle thereof. For example, a reflectance of light reflected from the cover layer CVL may be adjusted by adjusting a material, a thickness, and/or the number of layers included in the stacked first layer FL and the second layer SL. For example, in order to optimally increase the reflectance of the light incident on the cover layer CVL, the thicknesses of the first layer FL and the second layer SL may be adjusted according to a wavelength of the light and refractive indices. In a case where a refractive index of a stacked layer (inorganic layer) is n, a wavelength of light to be reflected is λ, and a low refractive layer (or a high refractive layer) and a high refractive layer (or a low refractive layer) of a thickness of λ/4n are alternately stacked each other, light of a specific wavelength (λ) area may be effectively reflected.

In an embodiment, the cover layer CVL may have a first thickness d1 in the third direction DR3. The first thickness d1 may be about 2 μm. The first thickness d1 may be a separation distance between the light emitting elements LD and the color conversion layer CCL.

The color conversion layer CCL and a second bank BNK2 may be positioned on the cover layer CVL. The color conversion layer CCL may be positioned on the cover layer CVL in the emission area EMA of the pixel PXL, and the second bank BNK2 may be positioned on the cover layer CVL in the non-emission area NEA of the corresponding pixel PXL.

The second bank BNK2 may be provided and/or formed on the cover layer CVL on the first bank BNK1 in the non-emission area NEA. The second bank BNK2 may have a dam structure that surrounds the emission area EMA of the pixel PXL and defines the emission area EMA by defining a position to which the color conversion layer CCL is to be supplied.

The second bank BNK2 may include a light blocking material. For example, the second bank BNK2 may be a black matrix. According to an embodiment, the second bank BNK2 may be configured to include at least one light blocking material and/or reflective material so as to allow light emitted from the color conversion layer CCL to proceed in the image display direction of the display device DD, thereby improving light output efficiency of the color conversion layer CCL.

The color conversion layer CCL may be formed on the cover layer CVL of each pixel PXL in the emission area EMA surrounded by the second bank BNK2.

The color conversion layer CCL may include color conversion particles QD corresponding to a specific color. For example, the color conversion layer CCL may include color conversion particles QD that convert light of a first color emitted from the light emitting elements LD into light of a second color (or a specific color) different from the light of the first color.

In case that the pixel PXL is a red pixel (or a red sub-pixel), the color conversion layer CCL of the pixel PXL may include color conversion particles QD of a red quantum dot that converts the light of the first color emitted from the light emitting elements LD into the light of the second color (or red light).

In case that the pixel PXL is a green pixel (or a green sub-pixel), the color conversion layer CCL of the pixel PXL may include color conversion particles QD of a green quantum dot that converts the light of the first color emitted from the light emitting elements LD into the light of the second color (or green light).

In case that the pixel PXL is a blue pixel (or a blue sub-pixel), the color conversion layer CCL of the pixel PXL may include color conversion particles QD of a blue quantum dot that converts the light of the first color emitted from the light emitting elements LD into the light of a third color (for example, blue light). In case that the pixel PXL is a blue pixel (or a blue sub-pixel), a light scattering layer including light scattering particles SCT (or a scatterer) may be provided instead of the color conversion layer CCL including the color conversion particles QD according to an embodiment. For example, in case that the light emitting elements LD emit blue-based light, the pixel PXL may include the light scattering layer including the light scattering particles SCT. The above-described light scattering layer may be omitted according to an embodiment. In case that the pixel PXL is a blue pixel (or a blue sub-pixel), a transparent polymer may be provided instead of the color conversion layer CCL according to another embodiment.

An upper substrate U_SUB may be disposed on the color conversion layer CCL and the second bank BNK2. The upper substrate U_SUB may be coupled to the display element layer DPL through an intermediate layer CTL or the like.

The intermediate layer CTL may be a transparent viscosity layer (or adhesive layer) for strengthening an adhesive force between the display element layer DPL and the upper substrate U_SUB, for example, an optically clear adhesive layer, but is not limited thereto. According to an embodiment, the intermediate layer CTL may be a refractive index conversion layer for improving the light output luminance of the pixel PXL by converting an angle of light emitted from the color conversion layer CCL and proceeding to the upper substrate U_SUB. According to an embodiment, the intermediate layer CTL may include a filler formed of an insulating material having an insulating property and an adhesive property.

The upper substrate U_SUB may include a base layer BSL, a color filter layer CFL, and a capping layer CPL.

The base layer BSL may be a rigid substrate or a flexible substrate, and a material or a property thereof is not particularly limited. The base layer BSL may be formed of the same material as the substrate SUB or may be formed of a material different from that of the substrate SUB.

The color filter layer CFL may be disposed on a surface of the base layer BSL to face the display element layer DPL. The color filter layer CFL may include a color filter corresponding to each pixel PXL. For example, the color filter layer CFL may include a first color filter CF1 disposed on the color conversion layer CCL of a pixel PXL (hereinafter, referred to as a "first pixel"), a second color filter CF2 disposed on the color conversion layer of an adjacent pixel (hereinafter referred to as a "second pixel") adjacent to the first PXL, and a third color filter CF3 disposed on the color conversion layer of an adjacent pixel (hereinafter referred to as a "third pixel") adjacent to the second pixel.

The first, second, and third color filters CF1, CF2, and CF3 may be disposed to overlap each other in the non-emission area NEA in the third direction DR3 and may be used as a light blocking member blocking light interference between adjacent pixels PXL. Each of the first, second, and third color filters CF1, CF2, and CF3 may include a color filter material that selectively transmits the light of the color converted and emitted from the corresponding color conversion layer. For example, the first color filter CF1 may be a red color filter, the second color filter CF2 may be a green color filter, and the third color filter CF3 may be a blue color filter, but are not limited thereto.

The capping layer CPL may be disposed on the color filter layer CFL. The capping layer CPL may be positioned on the color filter layer CFL to cover the color filter layer CFL, thereby protecting the color filter layer CFL. The capping layer CPL may be an inorganic layer including an inorganic material or an organic layer including an organic material.

According to the above-described embodiment, the cover layer CVL in which the first layer FL having the first refractive index and the second layer SL having the second refractive index are alternately and repeatedly stacked each other may be disposed between the electrodes PE1 and PE2 and the color conversion layer CCL. Therefore, the light proceeding in the rear surface direction of the color conversion layer CCL may be reflected to react with the conversion layer CCL by using the refractive index difference between the first layer FL and the second layer SL. Accordingly, loss of light may be minimized, thereby improving the light output efficiency of the pixel PXL.

According to the above-described embodiment, as the cover layer CVL having the first thickness d1 is disposed between the light emitting elements LD and the color conversion layer CCL, a distance between the light emitting elements LD and the color conversion layer may be secured. Therefore, a phenomenon in which the color conversion layer CCL is deteriorated due to heat emitted from the light emitting elements LD may be prevented, and thus reliability of the pixel PXL may be improved.

Figure 11:
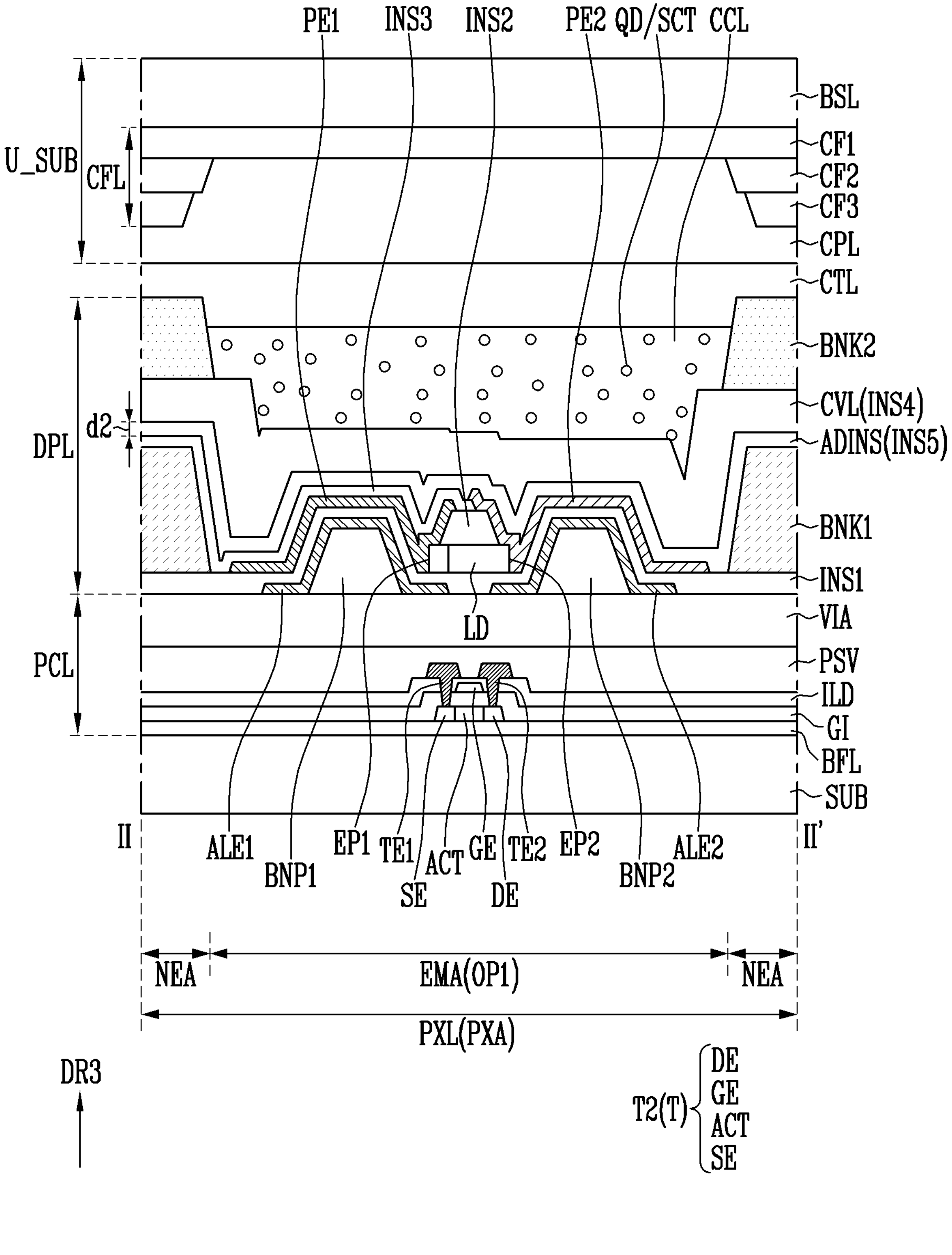
FIG. 11 is a schematic cross-sectional view corresponding to line II~II' of FIG. 5 and schematically illustrates a pixel according to an embodiment.
Figure 12:
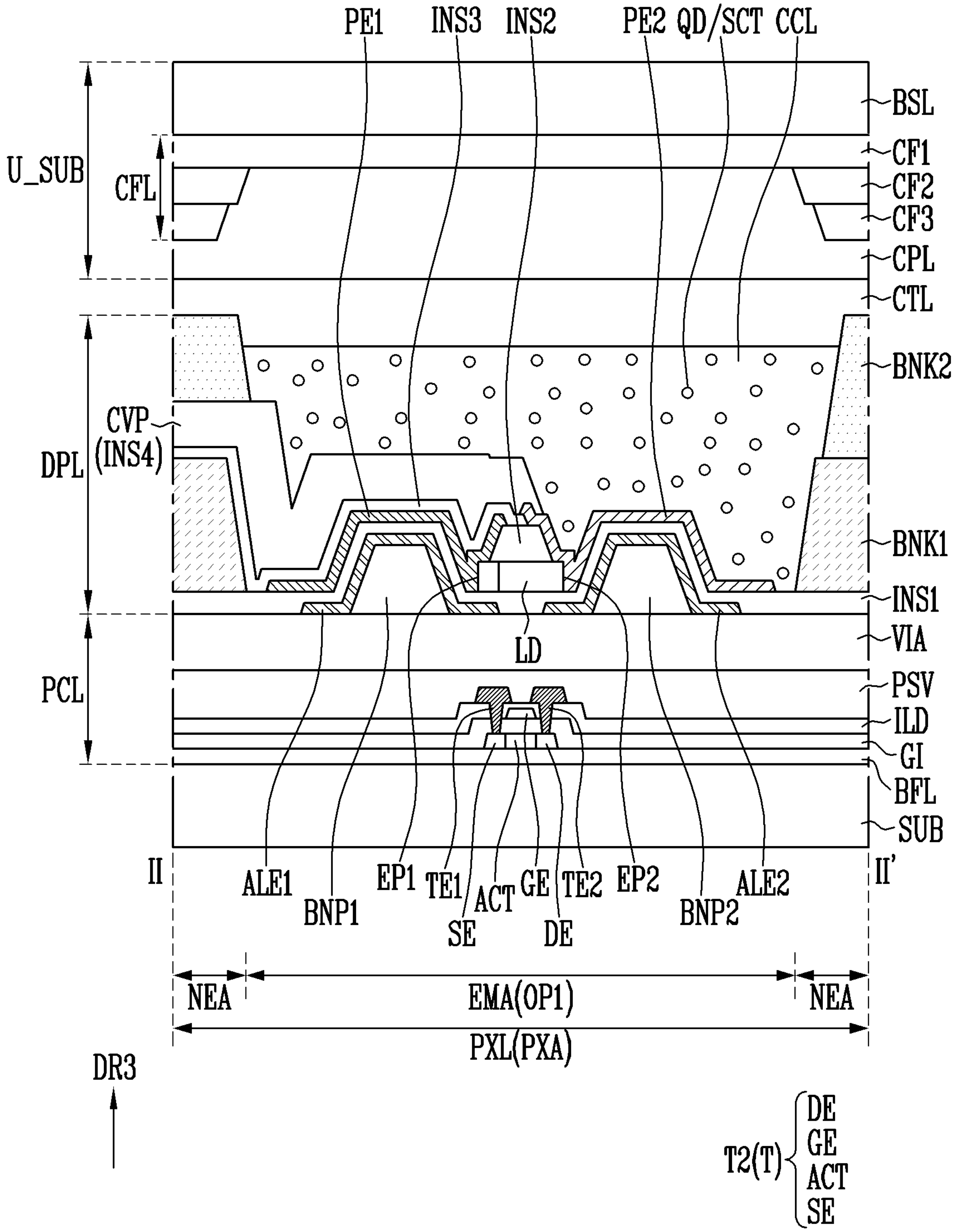
FIG. 12 is a schematic cross-sectional view corresponding to line II~II' of FIG. 5 and schematically illustrates a pixel according to an embodiment.

FIGS. 11 and 12 schematically illustrate a pixel PXL according to an embodiment, and are schematic cross-sectional views corresponding to line II~II' of FIG. 5.

Regarding the embodiments of FIGS. 11 and 12, a point different from that of the above-described embodiment is described in order to avoid an overlapping description.

Referring to FIGS. 1 to 5 and 11, the display element layer DPL of the pixel PXL may include an additional insulating layer ADINS.

The additional insulating layer ADINS may be a fifth insulating layer INS5 disposed between the electrodes PE and the cover layer CVL. The additional insulating layer ADINS may include an organic layer. The additional insulating layer ADINS may be a planarization layer for alleviating a step difference due to configurations positioned thereunder, for example, the electrodes PE, the third insulating layer INS3, and the first bank BNK1. In case that the additional insulating layer ADINS is formed of an organic layer, the cover layer CVL positioned thereon may have a flatter surface. A reflectance of light reflected from the cover layer CVL to the color conversion layer CCL may be further improved.

The above-described additional insulating layer ADINS may have a second thickness d2 in the third direction DR3. The second thickness d2 may be less than the first thickness d1 of the cover layer CVL described with reference to FIGS. 6 to 10. For example, the second thickness d2 may be in a range of about 1.0 μm to about 1.3 μm, but is not limited thereto.

The additional insulating layer ADINS may have a refractive index similar to that of the color conversion layer CCL, and may have a refractive index lower than that of the cover layer CVL. In an embodiment, the additional insulating layer ADINS may have a refractive index lower than that of a layer having a higher refractive index among the first and second layers FL and SL of the cover layer CVL described with reference to FIG. 9. For example, in case that the second layer SL has a refractive index greater than that of the first layer FL, the additional insulating layer ADINS may have a refractive index lower than that of the second layer SL.

As the additional insulating layer ADINS having a low refractive index is disposed under the cover layer CVL, light loss due to total reflection that may occur at an interface between the additional insulating layer ADINS, the cover layer CVL, and the color conversion layer CCL may be prevented. Therefore, an amount of light proceeding to an upper portion of the color conversion layer CCL may be increased, and thus the light output efficiency of the pixel PXL may be improved.

As the additional insulating layer ADINS is disposed under the cover layer CVL, a gap between the light emitting elements LD and the color conversion layer CCL may be further secured to prevent deterioration of the color conversion layer CCL.

According to an embodiment, the additional insulating layer ADINS may include an inorganic layer. The additional insulating layer ADINS may be designed to have a thickness equal to or greater than a thickness (or a diameter) of the light emitting elements LD, for example, greater than or equal to about 0.6 μm, in order to prevent total reflection of light emitted from a side surface of the light emitting elements LD.

Referring to FIGS. 1 to 5 and 12, the display element layer DPL of the pixel PXL may include a cover pattern CVP disposed between the electrodes PE and the color conversion layer CCL.

The cover pattern CVP may be disposed on the third insulating layer INS3 on the first electrode PE1 at least in the emission area EMA. The cover pattern CVP may include at least one or more sub-insulating layers including the first layer (refer to "FL" of FIG. 9) and the second layer (refer to "SL" in FIG. 9) sequentially stacked and having different refractive indices.

After the cover layer CVL described with reference to FIGS. 6 to 10 is formed on the second electrode PE2, the cover pattern CVP may be partially opened by removing a portion thereof through a photolithography process using a mask. The cover pattern CVP may cover the third insulating layer INS3 on the first electrode PE1 and expose the second electrode PE2. For example, the cover pattern CVP may include an opening, and the opening of the cover pattern CVP may expose the second electrode PE2. The color conversion layer CCL may be disposed directly on the cover pattern CVP and the exposed second electrode PE2.

As the cover pattern CVP is disposed only on the third insulating layer INS3 on the first electrode PE1, a movement path of total reflection that may occur inside the cover pattern CVP may be reduced, thereby minimizing loss of light incident on the cover pattern CVP.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments.

What is claimed is:

1. A display device comprising:
- a substrate including an emission area and a non-emission area;
- a plurality of light emitting elements disposed on the substrate;
- a first electrode and a second electrode disposed to be spaced apart from each other and electrically connected to the plurality of light emitting elements;
- a cover layer disposed on the first electrode and the second electrode; and
- a color conversion layer disposed on the cover layer, wherein
- the cover layer includes a plurality of sub-insulating layers each including a first layer and a second layer sequentially stacked,
- the first layer and the second layer have different refractive indices,
- the plurality of light emitting elements emits light having a first wavelength range,
- the color conversion layer includes color conversion particles that convert light having the first wavelength range into light having a second wavelength range different from the first wavelength range,
- the cover layer passes light having the first wavelength range and proceeding from the color conversion layer to the light emitting element, and
- the cover layer reflects light having the second wavelength range and proceeding from the color conversion layer to the light emitting element.

2. The display device according to claim 1, wherein
- the first layer is a first inorganic layer having a first refractive index, and
- the second layer is a second inorganic layer having a second refractive index.

3. The display device according to claim 2, wherein
- the first refractive index is less than the second refractive index,
- the first inorganic layer includes silicon oxide, and
- the second inorganic layer includes silicon nitride.

4. The display device according to claim 3, wherein
- each of the plurality of sub-insulating layers further includes a third layer stacked on the second layer, and
- the third layer is a third inorganic layer having a third refractive index.

5. The display device according to claim 4, wherein the third refractive index is different from the second refractive index.

6. The display device according to claim 2, wherein
- the second refractive index is less than the first refractive index,
- the first inorganic layer includes silicon nitride, and
- the second inorganic layer includes silicon oxide.

7. The display device according to claim 1, wherein the color conversion particles convert light emitted from the plurality of light emitting elements into light having the second wavelength range.

8. The display device according to claim 1, further comprising:
- a first insulating layer disposed between the substrate and the plurality of light emitting elements;
- a second insulating layer disposed on each of the plurality of light emitting elements; and
- a third insulating layer disposed on the first electrode.

9. The display device according to claim 8, wherein a thickness of the cover layer is less than or equal to about 2 μm.

10. The display device according to claim 8, further comprising:

an additional insulating layer disposed between the first and second electrodes and the cover layer.

11. The display device according to claim 10, wherein the additional insulating layer includes an organic layer.

12. The display device according to claim 11, wherein a thickness of the additional insulating layer is in a range of about 1.0 μm to about 1.3 μm.

13. The display device according to claim 10, wherein the additional insulating layer includes an inorganic layer.

14. The display device according to claim 8, further comprising:

a first alignment electrode and a second alignment electrode disposed between the substrate and the first insulating layer and spaced apart from each other;

a first bank disposed in the non-emission area and including an opening corresponding to the emission area;

a second bank disposed on the first bank in the non-emission area and surrounding the color conversion layer; and a color filter disposed on the color conversion layer.

15. The display device according to claim 14, wherein the first electrode is electrically connected to the first alignment electrode, and the second electrode is electrically connected to the second alignment electrode.

16. The display device according to claim 1, further comprising:

a pixel circuit layer disposed between the substrate and the plurality of light emitting elements and including at least one transistor electrically connected to the plurality of light emitting elements.

17. A display device comprising:

a plurality of light emitting elements disposed on a substrate;

a first electrode and a second electrode disposed to be spaced apart from each other and electrically connected to the plurality of light emitting elements;

a cover pattern disposed on the first electrode to cover the first electrode; and a color conversion layer disposed on the cover pattern, wherein the cover pattern includes:

a plurality of sub-insulating layers each including a first layer and a second layer sequentially stacked; and an opening, the first layer and the second layer have different refractive indices, and the opening of the cover pattern exposes the second electrode.

18. The display device according to claim 17, wherein the color conversion layer is disposed directly on the cover pattern and the second electrode, and the cover pattern is not disposed on the second electrode.

19. The display device according to claim 17, wherein the cover pattern selectively transmits light within a predetermined wavelength range.

20. An electronic device comprising a display device, wherein the display device comprises:

a substrate including an emission area and a non-emission area;

a plurality of light emitting elements disposed on the substrate;

a first electrode and a second electrode disposed to be spaced apart from each other and electrically connected to the plurality of light emitting elements;

a cover layer disposed on the first electrode and the second electrode; and a color conversion layer disposed on the cover layer, wherein the cover layer includes a plurality of sub-insulating layers each including a first layer and a second layer sequentially stacked, the first layer and the second layer have different refractive indices, the plurality of light emitting elements emits light having a first wavelength range, the color conversion layer includes color conversion particles that convert light having the first wavelength range into light having a second wavelength range different from the first wavelength range, the cover layer passes light having the first wavelength range and proceeding from the color conversion layer to the light emitting element, and the cover layer reflects light having the second wavelength range and proceeding from the color conversion layer to the light emitting element.

* * * * *